(12) United States Patent
Lin et al.

(10) Patent No.: US 12,376,311 B2
(45) Date of Patent: Jul. 29, 2025

(54) THREE-DIMENSIONAL MEMORY DEVICE WITH WORD LINES EXTENDING THROUGH SUB-ARRAYS, SEMICONDUCTOR DEVICE INCLUDING THE SAME AND METHOD FOR MANUFACTURING THE SAME

(71) Applicant: Taiwan Semiconductor Manufacturing Company, Ltd., Hsinchu (TW)

(72) Inventors: Meng-Han Lin, Hsinchu (TW); Han-Jong Chia, Hsinchu (TW); Yi-Ching Liu, Hsinchu (TW); Chia-En Huang, Hsinchu County (TW); Sheng-Chen Wang, Hsinchu (TW); Feng-Cheng Yang, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 93 days.

(21) Appl. No.: 18/346,278

(22) Filed: Jul. 3, 2023

(65) Prior Publication Data
US 2023/0345732 A1   Oct. 26, 2023

Related U.S. Application Data

(63) Continuation of application No. 17/121,757, filed on Dec. 15, 2020, now Pat. No. 11,744,080.
(Continued)

(51) Int. Cl.
*H10B 51/20* (2023.01)
*G11C 7/18* (2006.01)
(Continued)

(52) U.S. Cl.
CPC .............. *H10B 51/20* (2023.02); *G11C 7/18* (2013.01); *G11C 8/14* (2013.01); *H01L 23/5226* (2013.01); *H10B 51/10* (2023.02); *H10B 51/30* (2023.02)

(58) Field of Classification Search
CPC ..... H01L 23/5226; H10B 51/10; H10B 51/20; H10B 51/30; G11C 7/18; G11C 8/14
See application file for complete search history.

(56) References Cited

U.S. PATENT DOCUMENTS

2017/0179025 A1 * 6/2017 Yun ........................ H10B 43/10
2020/0075631 A1 * 3/2020 Dong .................. H01L 29/7827
(Continued)

FOREIGN PATENT DOCUMENTS

KR          20220010874 A  *  1/2020  ............. H10B 53/40

*Primary Examiner* — Matthew E Warren
(74) *Attorney, Agent, or Firm* — JCIPRNET

(57) ABSTRACT

A memory device, a semiconductor device and manufacturing methods for forming the memory device and the semiconductor device are provided. The memory device includes a stacking structure, a switching layer, channel layers and pairs of conductive pillars. The stacking structure includes alternately stacked isolation layers and word lines, and extends along a first direction. The stacking structure has a staircase portion and a connection portion at an edge region of the stacking structure. The connection portion extends along the staircase portion and located aside the staircase portion, and may not be shaped into a staircase structure. The switching layer covers a sidewall of the stacking structure. The channel layers cover a sidewall of the switching layer, and are laterally spaced apart from one another along the first direction. The pairs of conductive pillars stand on the substrate, and in lateral contact with the switching layer through the channel layers.

20 Claims, 32 Drawing Sheets

Related U.S. Application Data

(60) Provisional application No. 63/055,349, filed on Jul. 23, 2020.

(51) Int. Cl.
*G11C 8/14* (2006.01)
*H01L 23/522* (2006.01)
*H10B 51/10* (2023.01)
*H10B 51/30* (2023.01)

(56) References Cited

U.S. PATENT DOCUMENTS

| | | | |
|---|---|---|---|
| 2021/0043568 A1* | 2/2021 | Hyun | H01L 23/5283 |
| 2021/0098472 A1* | 4/2021 | Kim | H10B 43/27 |
| 2021/0151462 A1* | 5/2021 | Baek | H10B 41/50 |
| 2021/0366985 A1* | 11/2021 | Lin | H10N 70/8836 |
| 2021/0408038 A1* | 12/2021 | Lin | H10B 43/10 |
| 2022/0005830 A1* | 1/2022 | Wu | H10B 43/20 |

\* cited by examiner

THREE-DIMENSIONAL MEMORY DEVICE WITH WORD LINES EXTENDING THROUGH SUB-ARRAYS, SEMICONDUCTOR DEVICE INCLUDING THE SAME AND METHOD FOR MANUFACTURING THE SAME

CROSS-REFERENCE TO RELATED APPLICATION

This application is a continuation application of and claims the priority benefit of a prior application Ser. No. 17/121,757, filed on Dec. 15, 2020, now allowed. The prior application Ser. No. 17/121,757 claims the priority benefit of U.S. provisional application Ser. No. 63/055,349, filed on Jul. 23, 2020. The entirety of the above-mentioned patent applications is hereby incorporated by reference herein and made a part of this specification.

BACKGROUND

In the past decades, growing demand for data storage has led to continuously scaling of non-volatile memory, and to development of cells in the non-volatile memory from single-level cells (SLCs) to multi-level cells (MLCs). However, these solutions are limited by the confines of two-dimensional design. All of the cells in the non-volatile memory are lined up next to each other in a string, but there is only one level of cells. This ultimately limits the capacity that the non-volatile memory could offer.

Three-dimensional memory is a new evolution that solves some of the problems with storage capacity of the non-volatile memory. By stacking cells vertically, it is possible to dramatically increase the storage capacity without significantly increasing footprint area of the non-volatile memory. However, as a result of having large storage capacity, three-dimensional memory requires a significant amount of driving devices. As the storage capacity of three-dimensional memory continuously grows, it becomes more difficult to integrate the driving devices in a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
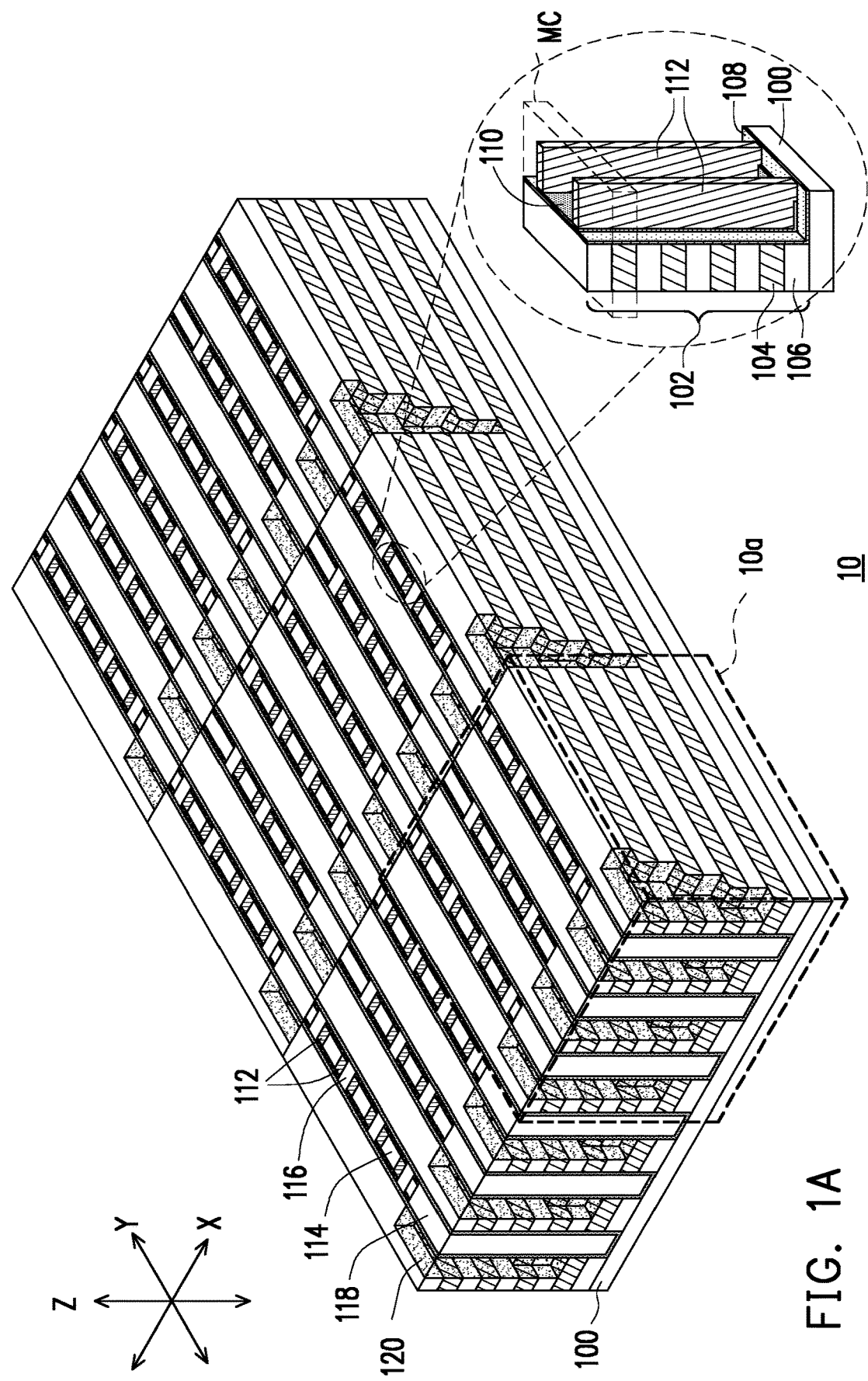
FIG. 1A is a schematic three-dimensional view illustrating a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
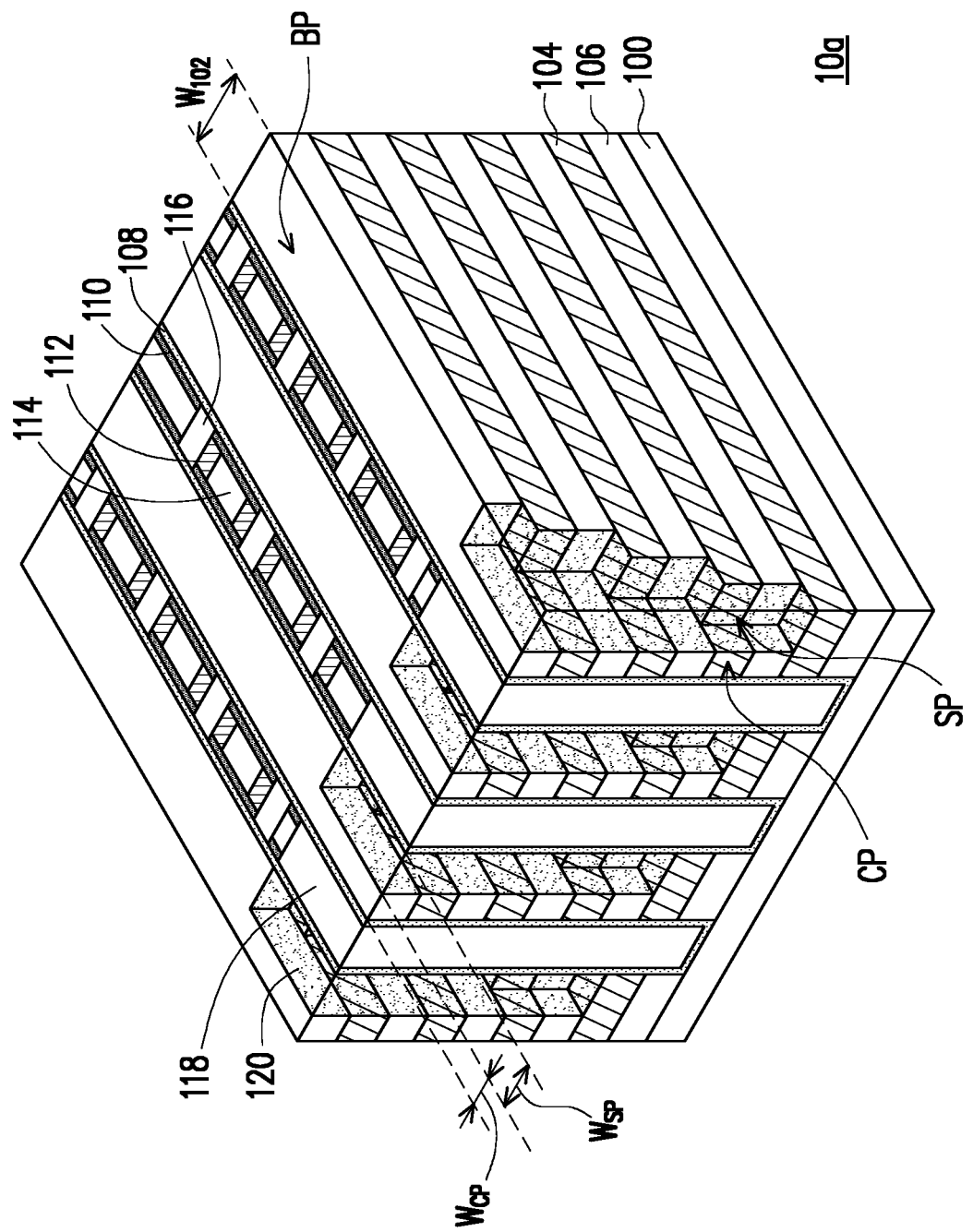
FIG. 1B is a schematic three-dimensional view illustrating a sub-array in the memory device shown in FIG. 1A.
Figure 1C:
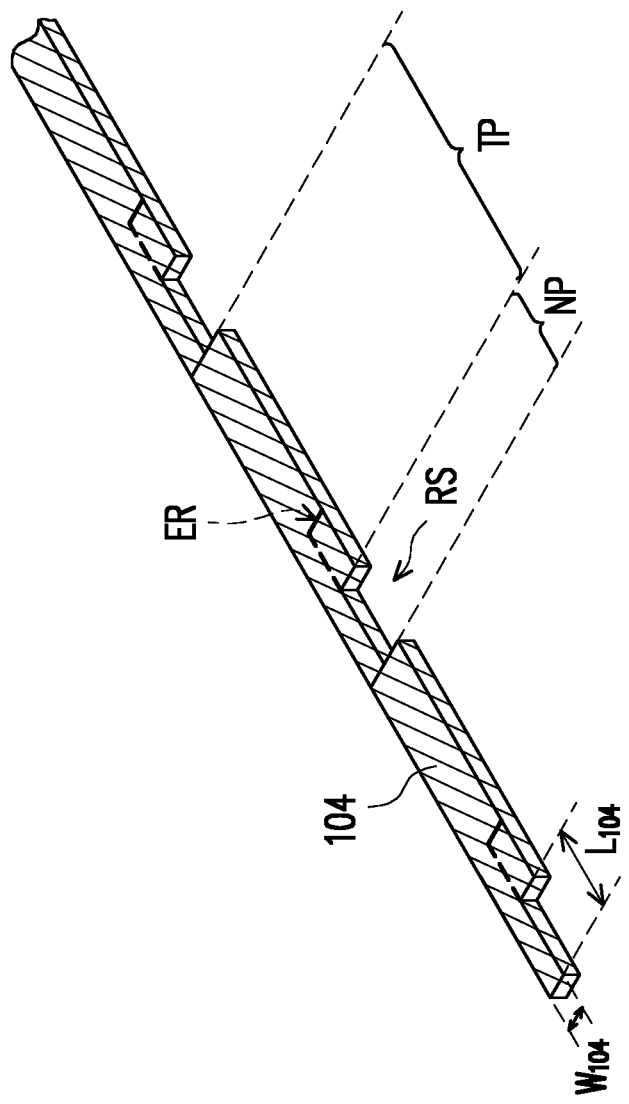
FIG. 1C is a schematic three-dimensional view illustrating a word line shared by a column of sub-arrays in the memory device shown in FIG. 1A.

FIG. 1A is a schematic three-dimensional view illustrating a memory device 10 according to some embodiments of the present disclosure. FIG. 1B is a schematic three-dimensional view illustrating a sub-array 10a in the memory device 10 shown in FIG. 1A. FIG. 1C is a schematic three-dimensional view illustrating a word line 104 shared by a column of sub-arrays 10a in the memory device 10 shown in FIG. 1A.

Referring to FIG. 1A, the memory device 10 is a three-dimensional memory device, and includes stacks of memory cells MC formed on a substrate 100. In some embodiments, the substrate 100 is an etching stop layer over a semiconductor substrate (not shown), such as a semiconductor wafer or a semiconductor-on-insulator (SOI) wafer. In these embodiments, active devices (e.g., transistors) and interconnections of these active devices (both not shown) may be formed between the substrate 100 and the semiconductor wafer (or the SOI wafer). In alternative embodiments, the substrate 100 is the semiconductor wafer or the SOI wafer.

A region enclosed by a circle in FIG. 1A is an enlarged view illustrating a portion of a stack of the memory cells MC in the memory device. As shown in the enlarged view, each stack of the memory cells MC includes a segment of a stacking structure 102 formed on the substrate 100. Word lines 104 and isolation layers 106 are alternately stacked along a vertical direction Z in the stacking structure 102. In some embodiments, the bottommost and topmost layers of each stacking structure 102 are respectively one of the isolation layers 106. Further, those skilled in the art may adjust the amount of the word lines 104 and the isolation layers 106 in each stacking structure 102 according to design and process requirements, the present disclosure is not limited thereto. In addition, in some embodiments, the word lines 104 and the isolation layers 106 in each stacking structure 102 extend along a direction Y, and the stacking structures 102 are laterally spaced apart from one another along a direction X intersected with the direction Y. Adjacent stacks of the memory cells MC arranged along the direction Y may share the same stacking structure 102. In addition, each stacking structure 102 may be shared by adjacent stacks of the memory cells MC arranged along the direction X. The word lines 104 may be formed of a conductive material, while the isolation layers 106 may be formed of an insulating material. For instance, the conductive material may include tungsten, titanium nitride, ruthenium, molybdenum, tungsten nitride or the like, whereas the insulating material may include silicon oxide, silicon nitride, silicon oxynitride or the like.

Further, switching layers 108 are formed on sidewalls the stacking structures 102, and in lateral contact with the word lines 104 and the isolation layers 106 in the stacking structures 102. In some embodiments, standing portions of each switching layer 108 cover opposing sidewalls of adjacent stacking structures 102, and a laterally extending portion of each switching layer 108 spans on a portion of the substrate 100 between theses stacking structures 102 and connects the standing portions of the switching layer 108. In addition, opposite sidewalls of each stacking structure 102 may be covered by different ones of the switching layers 108. Further, in some embodiments, the switching layers 108 continuously extend along the stacking structures 102, such that the switching layers 108 covering opposite sidewalls of each stacking structure 102 can be shared by a column of the memory cells MC arranged along the direction Y. The switching layers 108 may be formed of a ferroelectric material. For instance, the ferroelectric material may include a hafnium-oxide-based material (e.g., hafnium zirconium oxide ($Hf_{1-x}Zr_xO$), hafnium erbium oxide ($Hf_{1-x}Er_xO$), hafnium lanthanum oxide ($Hf_{1-x}Zr_xO$), hafnium yttrium oxide ($Hf_{1-x}Y_xO$), hafnium gadolinium oxide ($Hf_{1-x}Gd_xO$), hafnium aluminum oxide ($Hf_{1-x}Al_xO$), hafnium titanium oxide ($Hf_{1-x}Ti_xO$), hafnium tantalum oxide ($Hf_{1-x}Ta_xO$) or the like), barium titanate (e.g., $BaTiO_3$), lead titanate (e.g., $PbTiO_3$), lead zirconate (e.g., $PbZrO_3$), lithium niobate ($LiNbO_3$), sodium niobate ($NaNbO_3$), potassium niobate (e.g., $KNbO_3$), potassium tantalate ($KTaO_3$), bismuth scandate ($BiScO_3$), bismuth ferrite (e.g., $BiFeO_3$), aluminum scandium nitride (AlScN), the like or combinations thereof.

Channel layers 110 cover sidewalls of the standing portions of the switching layers 108, and are in lateral contact with word lines 104 and the isolation layers 106 in the stacking structures 102 through the standing portions of the switching layers 108. In some embodiments, opposite sidewalls of each stacking structure 102 are respectively covered by laterally separated ones of the channel layers 110, such that each channel layer 110 may be exclusively shared by a stack of the memory cells MC. In these embodiments, cross-talk between adjacent stacks of the memory cells MC arranged along the direction Y may be reduced. In addition, in some embodiments, the channel layers 110 at opposing sidewalls of adjacent stacking structures 102 are separated from one another. In these embodiments, the channel layers 110 may or may not laterally extend on bottom portions of the switching layers 108, but each of the channel layers 110 may not further extend to be in contact with another one of the channel layers 110. The channel layers 110 may be formed of polysilicon or a metal oxide semiconductor material. The metal oxide semiconductor material may include an indium-based oxide material, such as indium gallium zinc oxide (IGZO).

Pairs of conductive pillars 112 stand over the portions of the substrate 100 between the stacking structures 102. In those embodiments where the channel layers 110 are discontinuous on the portions of the substrate 100 between the stacking structures 102, the conductive pillars 112 may at least partially stand on the bottom portions of the switching layers 108. The conductive pillars 112 of each pair are separately located between and in lateral contact with two of the channel layers 110 covering opposing sidewalls of adjacent stacking structures 102. Further, adjacent pairs of the conductive pillars 112 arranged along the direction Y are laterally separated as well. In some embodiments, isolation structures 114 are respectively filled between the conductive pillars 112 of each pair, so as to isolate the conductive pillars 112 of each pair from one another. In addition, in some embodiments, isolation pillars 116 respectively stand between adjacent pairs of the conductive pillars 112. In these embodiments, the isolation pillars 116 may further extend to be in lateral contact with the switching layers 108, so as to separate the channel layers 110 from one another. Moreover, in some embodiments, pairs of the conductive pillars 112 at a side of a stacking structure 102 are offset from pairs of the conductive pillars 112 at the other side of the stacking structure 102 along the direction Y. In these embodiments, the conductive pillars 112 may be referred as being arranged in a staggered configuration. The conductive pillars 112 are formed of a conductive material, while the isolation structures 114 and the isolation pillars 116 are respectively formed of an insulating material. For instance, the conductive material may include Al, Ti, TiN, TaN, Co, Ag, Au, Cu, Ni, Cr, Hf, Ru, W, Pt or the like, whereas the insulating material may include silicon oxide, silicon nitride, silicon oxynitride, silicon carbide, silicon carbo-nitride, silicon carbo-oxide or the like.

A section of one of the word lines 104, a portion of one of the switching layers 108 that is in lateral contact with this section of the word line 104, a portion of one of the channel layers 110 capacitively coupled to the section of the word line 104 through the portion of the switching layer 108, and a pair of the conductive pillars 112 in contact with this channel layer 110 collectively form a transistor. The section of the word line 104 is functioned as a gate terminal of the transistor, and the pair of the conductive pillars 112 are functioned as source and drain terminals of the transistor. When the transistor is turned on, a conductive path may be formed in the portion of the channel layer 110, and extend between the pair of the conductive pillars 112. On the other hand, when the transistor is in an off state, the conductive path may be cut off or absent. The portion of the switching layer 108 is functioned for realizing capacitive coupling between the section of the word line 104 and the portion of the channel layer 110, and for switching a threshold voltage of the transistor from a lower value to a higher value (or vice versa). During a programming operation, a voltage bias is set across the portion of the switching layer 108, and a dipole moment is stored in the switching layer 108 due to ferroelectric polarization. On the other hand, during an erasing operation, a reverse voltage bias may be set across the portion of the switching layer 108, and a dipole moment reversal can be observed in the switching layer 108. By storing the dipole moments with opposite directions, the transistor may have a relatively high threshold voltage and a relatively low threshold voltage, thus a high logic state and a low logic state can be stored in the transistor. Accordingly, the transistor is capable of storing data, and is referred as the memory cell MC in the present disclosure.

As shown in FIG. 1A, the memory cells MC in the same stack may share the same switching layer 108, the same channel layer 110, and the same pair of the conductive pillars 112, while being controlled by different word lines 104. Adjacent stacks of the memory cells MC at opposite sides of a pair of the conductive pillars 112 may share the same switching layer 108 and this pair of the conductive pillars 112, while having different channel layers 110 and controlled by different word lines 104. Adjacent stacks of the memory cells MC at opposite sides of the same stacking structure 102 may share the same word lines 104, while having different switching layers 108, different channel layers 110 and different pairs of the conductive pillars 112. In addition, adjacent stacks of the memory cells MC arranged along the direction Y may share the same word lines 104 and the same switching layer 108, while having different channel layers 110 and different pairs of the conductive pillars 112.

Referring to FIG. 1A and FIG. 1B, the memory device 10 may be divided into a plurality of sub-arrays 10a. Although 6 of the sub-arrays 10a are depicted in FIG. 1A, the memory device 10 may have less than or more than 6 of the sub-arrays 10a, the present disclosure is not limited to the amount of the sub-arrays 10a. As shown in FIG. 1A, the sub-arrays 10a are arrange along the direction X and the direction Y, and are connected with one another. Each of the stacking structures 102 as well as the switching layers 108 at opposite sides thereof continuously extend along the direction Y, and are shared by a column of the sub-arrays 10a arranged along the direction Y. In addition, adjacent sub-arrays 10a arranged along the direction X may be connected with each other through a shared stacking structure 102. As shown in FIG. 1B, each stacking structure 102 has a staircase portion SP within its edge portion that is connected to an adjacent sub-array 10a in the same column. The staircase portion SP is designed for out-routing the word lines 104 in the stacking structure 102. In the staircase portion SP of the stacking structure 102, each word line 104 and the underlying isolation layer 106 are laterally recessed from an underlying word line 104 and the isolation layer 106 below this lower word line 104. In those embodiments where the topmost word line 104 is covered by a topmost isolation layer 106, the topmost isolation layer 106 is laterally recessed from the topmost word line 104 lying below the topmost isolation layer 106. A width $W_{SP}$ of the staircase portion SP is shorter than a total width $W_{102}$ of the stacking structure 102, such that the stacking structure 102 within a sub-array 10a can continuously extend to an adjacent sub-array 10a through a connection portion CP extending aside the staircase portion SP. The connection portion CP is not shaped into a staircase structure, and is identical with a body portion BP of the stacking structure 102, except that a width $W_{CP}$ of the connection portion CP is shorter than a width of the body portion BP (i.e., the width $W_{102}$). In other words, the word lines 104 and the isolation layers 106 in the connection portion CP have substantially identical length. In addition, the total width $W_{102}$ of the stacking structure 102 is a sum of the width of the staircase portion $W_{SP}$ and the width $W_{CP}$ of the connection portion CP. Further, a sidewall of the connection portion CP is partially shared by the staircase portion SP. It should be noted that, the term "width" described herein indicates a dimension along a direction perpendicular with an extending direction of the stacking structure 102, while the term "length" described herein indicates a dimension along the extending direction of the stacking structure 102. For instance, the term "width" indicates a dimension along the direction X, which is intersected with the direction Y along which the stacking structure 102 extends. On the other hand, the term "length" indicates a dimension along the direction Y. In some embodiments, a ratio of the width $W_{SP}$ with respect to the width $W_{CP}$ ranges from 0.1 to 10, and a ratio of the width $W_{SP}$ with respect to the width $W_{102}$ ranges from 0.1 to 0.9. However, those skilled in the art may adjust these widths according to process and design requirements, the present disclosure is not limited thereto.

In some embodiments, the staircase portions SP are at the same halves (e.g., left halves) of the stacking structures 102. In these embodiments, each switching layer 108 covering opposing sidewalls of adjacent stacking structures 102 may be in lateral contact with sidewalls of the connection portions CP of one of these stacking structures 102, and in lateral contact with sidewalls of the staircase portions SP of the other one of these stacking structures 102. Further, viewing the sub-array 10a individually (as shown in FIG. 1B), the staircase portions SP and the connection portions CP of the stacking structures 102 may be regarded as elongated portions of the body portions BP of the stacking structures 102. The elongated portions being shaped into staircase structures are referred as the staircase portions SP, whereas the elongated portions not being shaped into staircase structures are referred as the connection portions CP.

In some embodiments, the staircase portions SP and the connection portions CP of the stacking structures 102 within each sub-array 10a are located at a single side of the sub-array 10a. In these embodiments, as shown in FIG. 1A, the stacking structures 102 within a sub-array 10a extend to an adjacent sub-array 10a in the same column through their connection portions CP, while extending to another adjacent sub-array 10a in the same column through their body portions BP. Further, in some embodiments, insulating structures 118 are filled between edge portions of the stacking structures 102. The insulating structures 118 may stand on the laterally extending portions of the switching layers 108. In addition, the insulating structures 118 may be lateral contact with the standing portions of the switching layers 108 without a channel layer in between. Moreover, in some embodiments, interlayer dielectric structures 120 are formed on the staircase portions SP of the stacking structures 102. The steps in the staircase portions SP of the stacking structures 102 are covered by the interlayer dielectric structures 120, and the interlayer dielectric structures 120 may be filled to a height substantially leveled with top surfaces of the connection portions CP and body portions BP of the stacking structures 102. In addition, the interlayer dielectric structures 120 may respectively be in lateral contact with one of the switching layers 108. The insulating structures 118 and the interlayer dielectric structures 120 may respectively be formed of an insulating material. For instance, the insulating material may include silicon oxide, silicon nitride, silicon oxynitride, silicon carbide, silicon carbo-nitride, silicon carbo-oxide or the like.

Referring to FIG. 1B and FIG. 1C, as a result of shaping portions of each stacking structure 102 at edges of the sub-arrays 10a into staircase structures (i.e., the staircase portions SP), the word lines 104 (except for the bottommost word lines 104) in the stacking structures 102 may respectively have thick portions TP and narrow portions NP. The thick portions TP and the narrow portions NP of each stacking structure 102 are alternately arranged along the direction Y. The narrow portions NP of the word lines 104 are included in the connection portions CP of the stacking structures 102 as described with reference to FIG. 1B. On the other hand, edge regions ER of the thick portions TP are in lateral contact with the narrow portions NP, and are included in the staircase portions SP of the stacking structures 102. In addition, other regions of the thick portions TP are included in the body portions BP of the stacking structures 102. Alternatively, these word lines 104 may be described as having a plurality of lateral recesses RS. The lateral recesses RS indicate the removed portions of the word lines 104 for forming the steps of the staircase structures, and are defined by sidewalls of the narrow portions NP and some edges of the thick portions TP. In some embodiments, a width $W_{104}$ of the narrow portion NP of the word line 104 along the direction X, which may be substantially equal to the width $W_{CP}$ as described with reference to FIG. 1B, ranges from 10 nm to 1000 nm. In addition, a length $L_{104}$ of the narrow portion NP of the word line 104 along the direction Y, may range from 500 nm to 10000 nm.

Figure 2A:
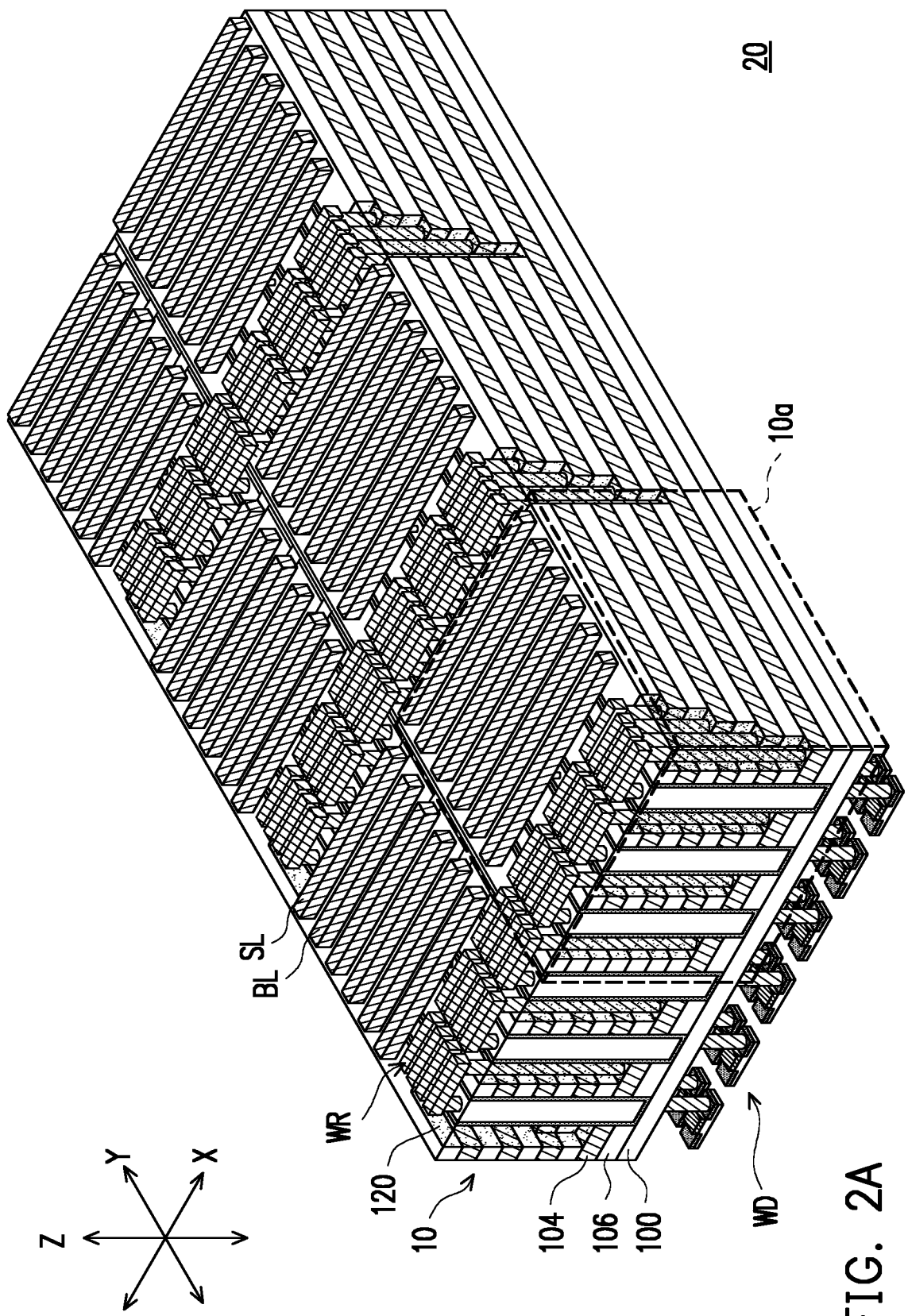
FIG. 2A is a schematic three-dimensional view illustrating a semiconductor device including the memory device as shown in FIG. 1A.
Figure 2B:
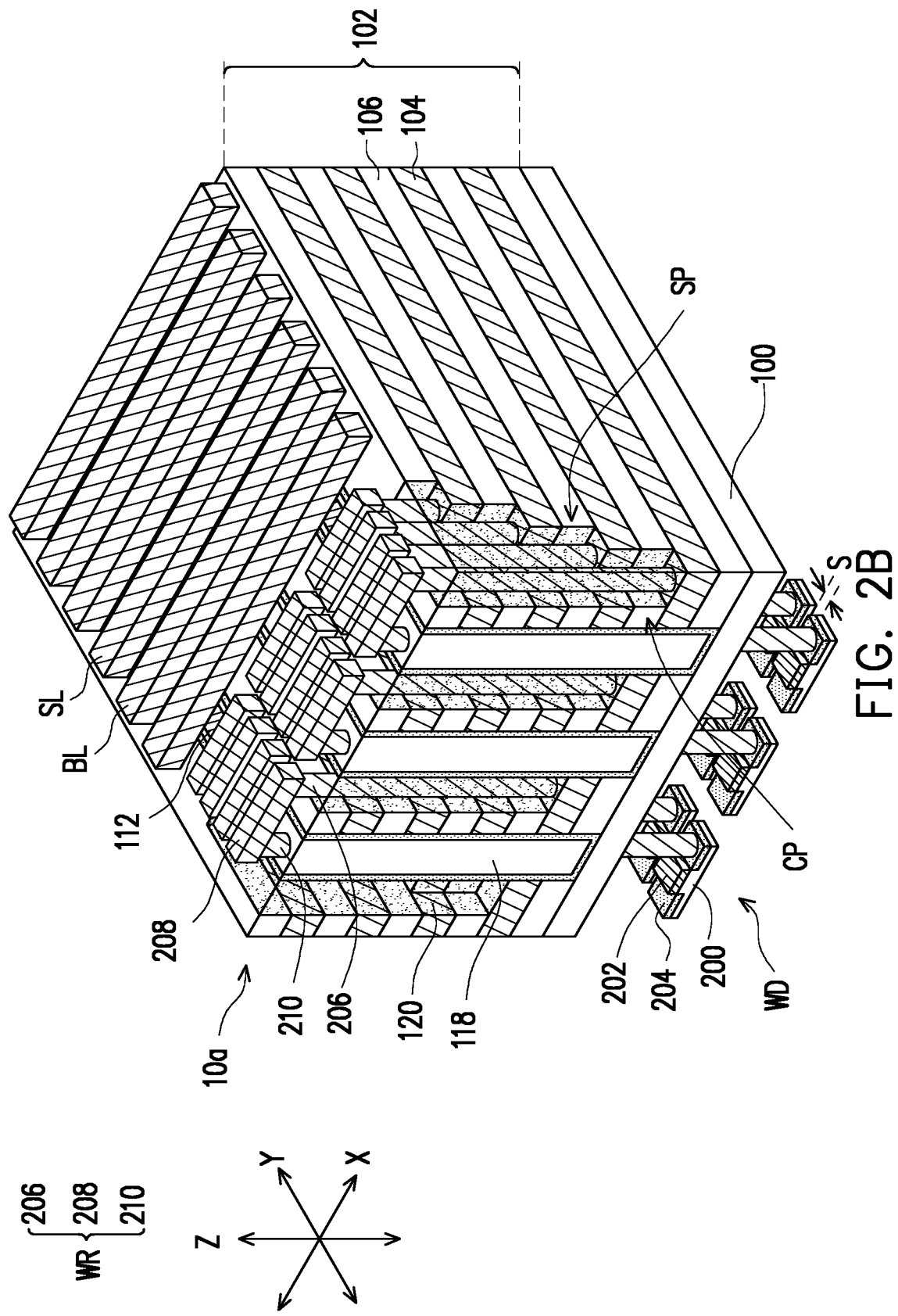
FIG. 2B is a schematic three-dimensional view illustrating a sub-array of the memory device and underlying word line drivers of the semiconductor device shown in FIG. 2A.
Figure 2C:
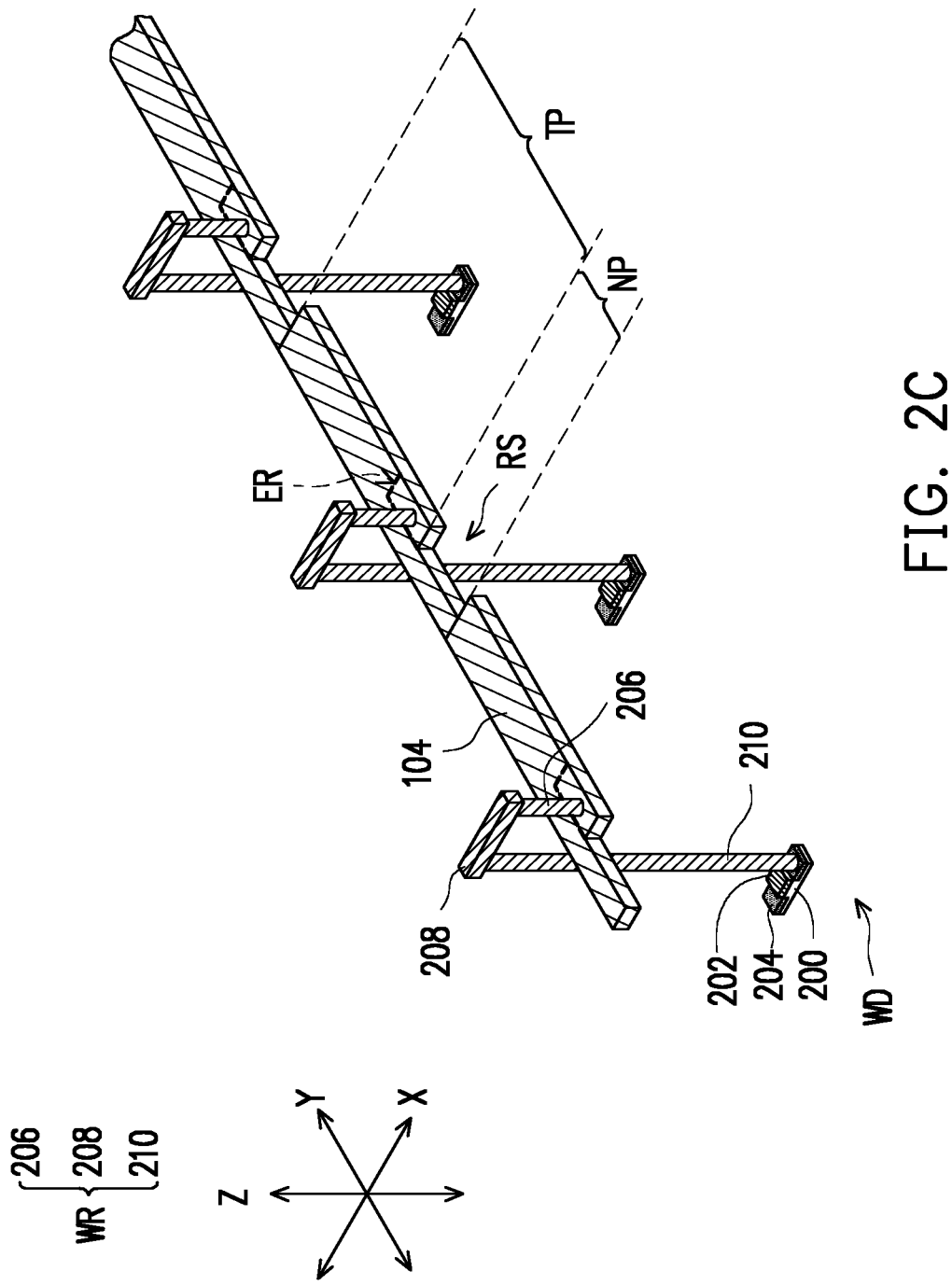
FIG. 2C is a schematic three-dimensional view illustrating one of the word lines as well as corresponding word line drivers and word line routings in the semiconductor device shown in FIG. 2A.

FIG. 2A is a schematic three-dimensional view illustrating a semiconductor device 20 including the memory device 10 as shown in FIG. 1A. FIG. 2B is a schematic three-dimensional view illustrating a sub-array 10a of the memory device 10 and underlying word line drivers WD of the semiconductor device 20 shown in FIG. 2A. FIG. 2C is a schematic three-dimensional view illustrating one of the word lines 104 as well as corresponding word line drivers WD and word line routings WR in the semiconductor device 20 shown in FIG. 2A.

Referring to FIG. 2A and FIG. 2B, the semiconductor device 20 includes the memory device 10 as described with reference to FIG. 1A through FIG. 1C. In addition, the semiconductor device 20 further includes word line drivers WD for driving the word lines 104 in the memory device 10. In embodiments where the substrate 100 of the memory device 10 is an etching stop layer lying over a semiconductor substrate, the word line drivers WD may include transistors formed on the semiconductor substrate 200 (partly shown in FIG. 2B) and arranged below the substrate 100. In these embodiments, the word line drivers WD may be regarded as a portion of a front-end-of-line (FEOL) structure of the semiconductor device 10, whereas the memory device 10 may be integrated in a back-end-of-line (BEOL) structure of the semiconductor device 20. In some embodiments, at least some of the word line drivers WD are overlapped with the staircase portions SP of the stacking structures 102 as described with reference to FIG. 1B. As shown in FIG. 2B, the transistors of the word line drivers WD respectively include a gate structure 202 and source/drain structures 204 at opposite sides of the gate structure 202. In some embodiments, the gate structure 202 is formed on a substantially flat surface of the semiconductor substrate 200, and the source/drain structures 204 are doping regions in the semiconductor substrate 200 or epitaxial structures formed in recesses of the semiconductor substrate 200. In these embodiments, the transistors of the word line drivers WD are referred as planar-type transistors, and skin portions of the semiconductor substrate 200 respectively covered by the gate structure 202 and extending between the source/drain structures 204 is functioned as a conductive channel of the transistor. In alternative embodiments, the transistors of the word line drivers WD are respectively formed as a fin-type transistor or a gate-all-around (GAA) transistor. In these alternative embodiments, three-dimensional structure(s) (e.g., fin structure(s), nanosheet(s) or the like) intersected with and covered by a gate structure are functioned as conductive channel(s) of the transistor. In some embodiments, a spacing S between adjacent transistors of the word line drivers ranges from 10 nm to 1000 nm. Furthermore, although not shown, the word line drivers WD may further include other active device(s) and/or passive device(s).

Referring to FIG. 2B and FIG. 2C, the word lines 104 in the memory device 10 may be routed to the word line drivers WD via word line routings WR. In some embodiments, the word line routings WR for connecting each of the word lines 104 to the corresponding word line driver WD include conductive vias 206, conductive traces 208 and through vias 210. One of the conductive vias 206 stands on a step in one of the staircase portions SP of the corresponding stacking structure 102, so as to establish electrical connection with the word line 104 shaped to form this step. In addition, the conductive via 206 may penetrate through a portion of the interlayer dielectric structure 120 covering this step, to a height higher than the top surfaces of the stacking structures 102 and the interlayer dielectric structures 120. One of the conductive traces 208 laterally extends over the conductive via 206, and is electrically connected to the conductive via 206. For instance, the conductive trace 208 may extend along the direction X. One of the through vias 210 may extend from a bottom surface of the conductive trace 208 to one of the source/drain structures 204 of the corresponding transistor in the word line drivers WD. In addition, the through via 210 is laterally spaced apart from the conductive via 206. In some embodiments, the through via 210 penetrates through one of the insulating structures 118, the substrate 100 and dielectric layers (not shown) formed between the word line drivers WD and the substrate 100. In these embodiments, the through vias 210 penetrate through the memory device 10, rather than being disposed around the memory device 10. In addition, the conductive traces 208 may extend within the boundary of the memory device 10, rather than extending out of the boundary of the memory device 10. Accordingly, the word lines 104 can be routed to the word line drivers WD within a smaller area. Further, the through via 210 may have a height greater than a height of the conductive via 206, sine the through via 210 extends from the BEOL structure to the FEOL structure of the semiconductor device 20, while the conductive via 206 extends within the BEOL structure of the semiconductor device 20. As shown in FIG. 2C, the conductive vias 206 may stand on the thick portions TP of the word lines 104. Further, the conductive traces 208 respectively rout one of the conductive vias 206 from a side (e.g., right side) of the corresponding word line 104 to an opposite side (e.g., left side) of this word line 104.

Referring back to FIG. 2B, the semiconductor device 20 further includes source lines SL and bit lines BL connected to the conductive pillars 112 in the memory device 10. The conductive pillars 112 of each pair are connected to one of the source lines SL and one of the bit lines BL, respectively. In addition, each of the source lines SL and each of the bit lines BL are respectively connected to a row of the conductive pillars 112 arranged along the direction X. In those embodiments where the conductive pillars 112 are arranged in a staggered configuration as described with reference to FIG. 1A, the source lines SL and the bit lines BL may be alternately arranged. For instance, the source lines SL and the bit lines BL may extend along the direction X, and may be alternately arranged along the direction Y. In alternative embodiments, the source lines SL or the bit lines BL are formed in the dielectric layers (not shown) between the word line drivers WL and the substrate 100, while the others of the source lines SL and the bit lines BL extend over the memory device 10. In these embodiments, conductive vias (not shown) extending from bottom surfaces of some of the conductive pillars 112 to the source lines SL or the bit lines BL through the substrate 100 may be further formed.

As described above, the memory cells MC formed in the stacking structures 102 and elements between the stacking structures 102 are stackable, thus the memory device 10 is no longer limited by two-dimensional design, and a storage density of the memory device 10 may be significantly increased. Further, the staircase portions SP of the stacking structures 102 respectively have a width (i.e., the width $W_{SP}$ as described with reference to FIG. 1B) shorter than a width of the corresponding stacking structure 102 (i.e., the width $W_{102}$ described with reference to FIG. 1B). Thus, the word lines 104 in each stacking structure 102 are not cut off at interface between adjacent sub-arrays 10a arranged along an extending direction of the stacking structures 102. Instead, the word lines 104 in each stacking structure 102 may extend through the interface via the connection portion CP of the stacking structure 102 extending along the staircase portion SP of the stacking structure 102. Since each word line 104 in the corresponding stacking structure 102 can continuously extend through multiple sub-arrays 10a, smaller driving current is required for driving the word lines 104. Therefore, dimensions of the word line drivers WD (e.g., dimensions of the transistors in the word line drivers WD) can be further scaled, and more active devices and/or passive devices can be integrated in the FEOL structure of the semiconductor device 20. Otherwise, if the dimensions of the word line drivers WD are not further scaled, driving ability of the word line drivers WD (e.g., the transistors in the word line drivers WD) can be equivalently improved.

Figure 3:
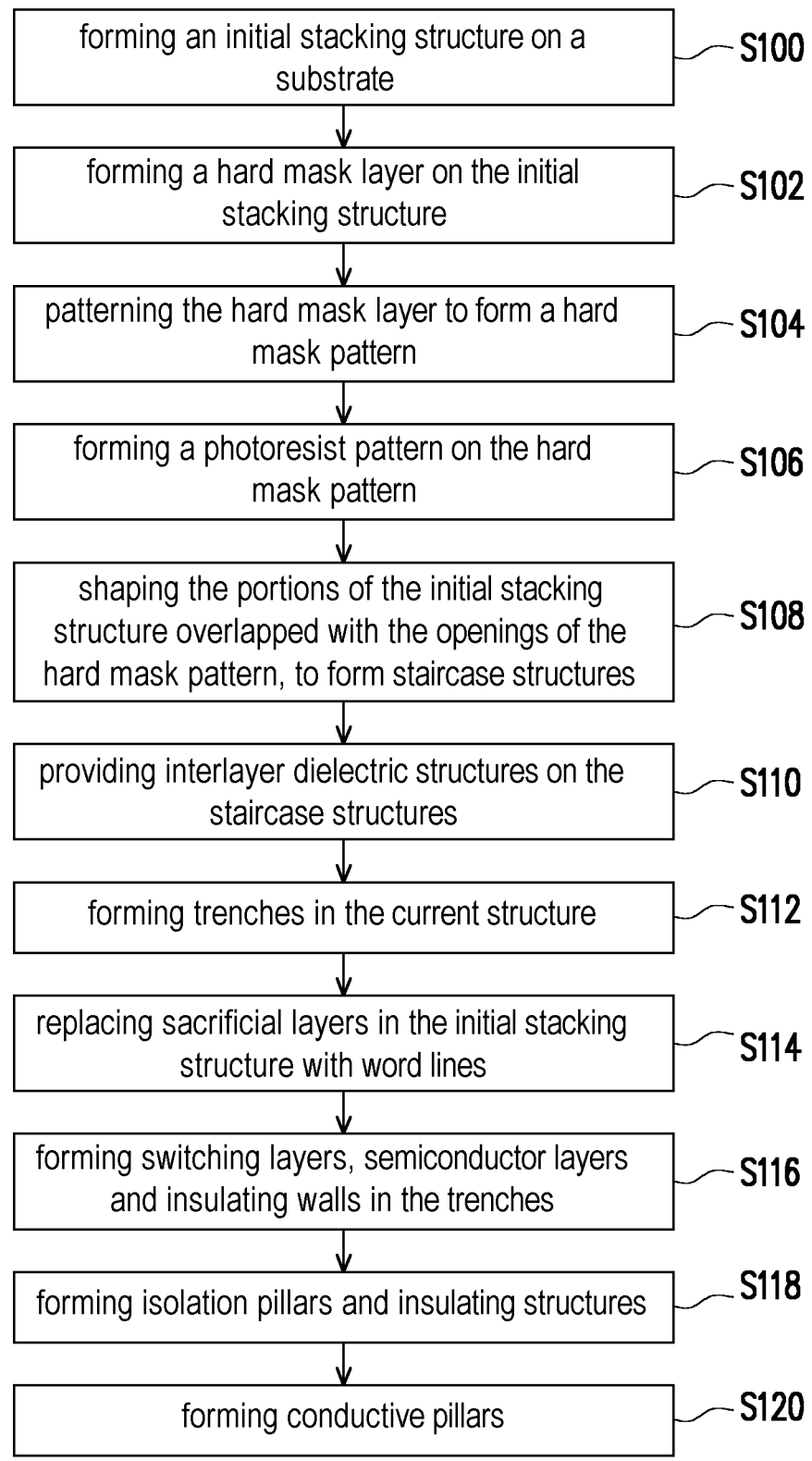
FIG. 3 is a flow diagram illustrating a manufacturing method of the memory device as shown in FIG. 1A.

FIG. 3 is a flow diagram illustrating a manufacturing method of the memory device 10 as shown in FIG. 1A. FIG. 4A through FIG. 4J are schematic three-dimensional view illustrating intermediate structures at various stages during the manufacturing process of the memory device 10 as shown in FIG. 3. FIG. 5A through FIG. 5J are schematic three-dimensional view illustrating a sub-array region 40a of the intermediate structures shown in FIG. 4A through FIG. 4J, respectively.

It should be noticed that, the intermediate structures to be described with reference to FIG. 4A through FIG. 4J can be divided into sub-array regions 40a. The sub-array regions 40a will become the sub-arrays 10a shown FIG. 1A, and one of the sub-array regions 40a of each intermediate structure is further illustrated in FIG. 5A through FIG. 5J.

Figure 4A:
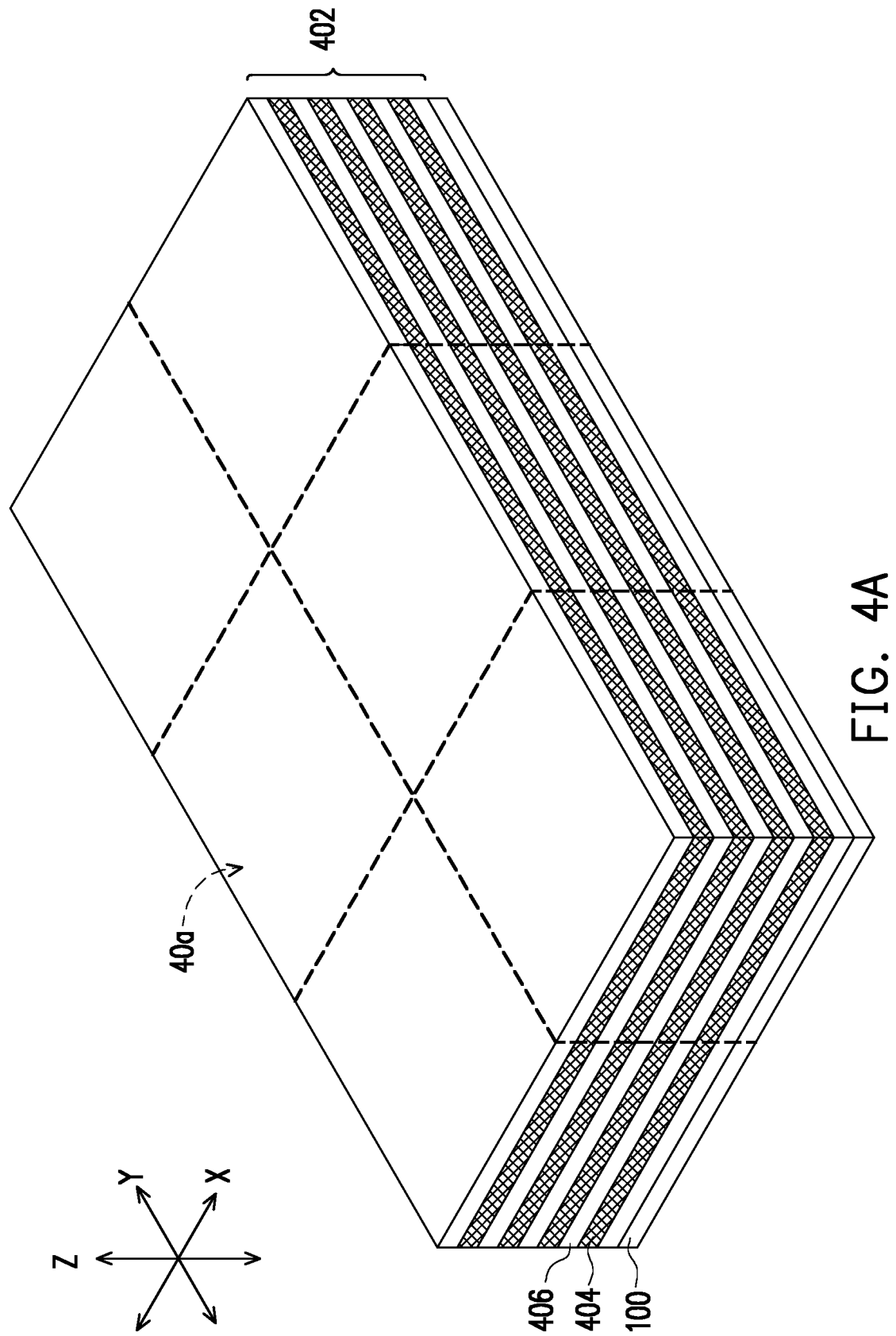
FIG. 4A through FIG. 4J are schematic three-dimensional view illustrating intermediate structures at various stages during the manufacturing process of the memory device as shown in FIG. 3.
Figure 5A:
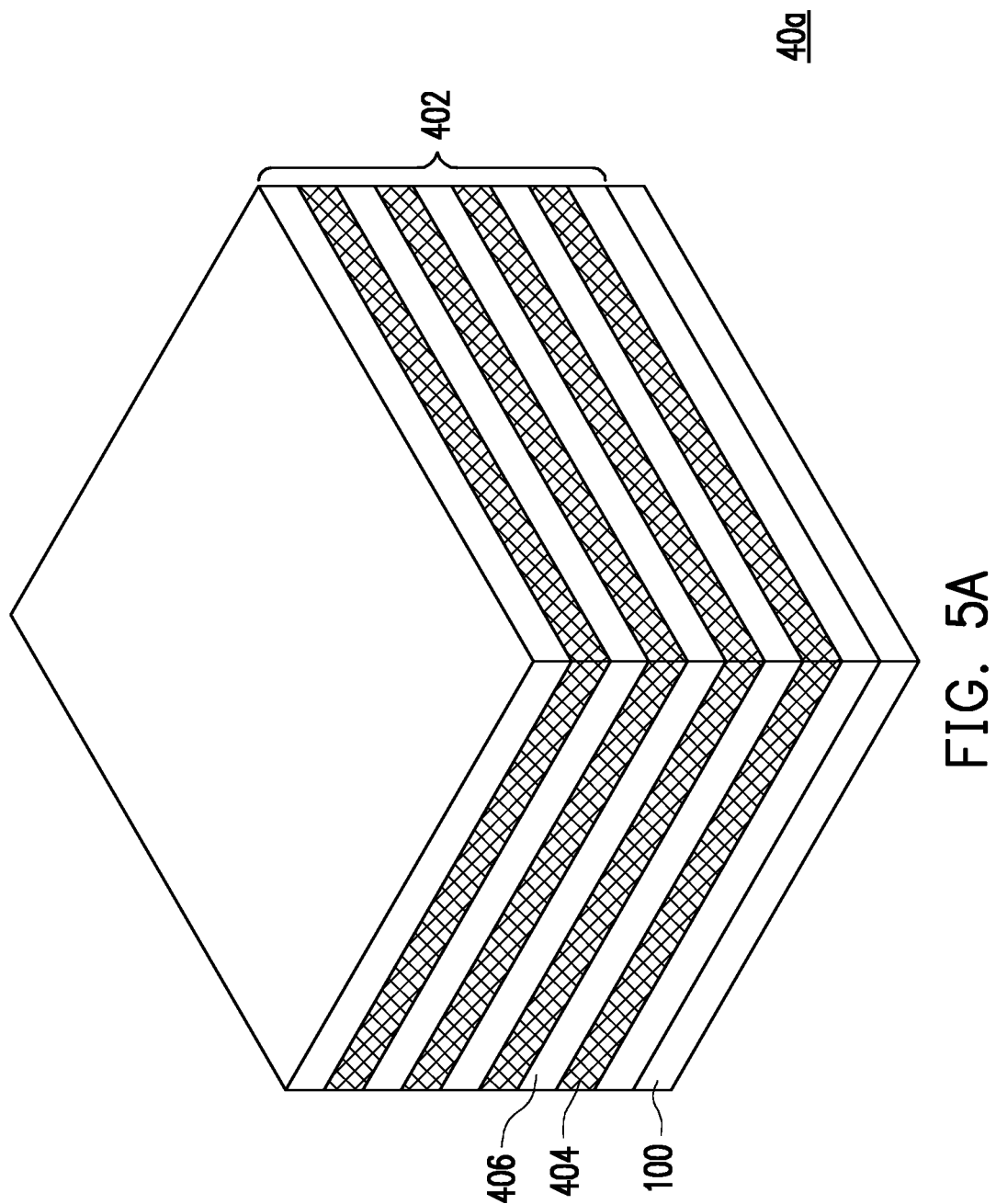
FIG. 5A through FIG. 5J are schematic three-dimensional view illustrating a sub-array region of the intermediate structures shown in FIG. 4A through FIG. 4J, respectively.
Figure 5A:
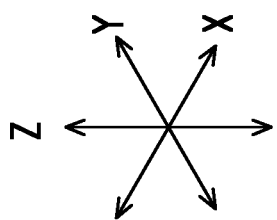

Referring to FIG. 3, FIG. 4A and FIG. 5A, step S100 is performed, and an initial stacking structure 402 is formed on the substrate 100. The initial stacking structure 402 includes sacrificial layers 404 and isolation layers 406 alternately stacked along the vertical direction Z. The sacrificial layers 404 will be patterned, and replaced to form the word lines 104 as shown in FIG. 1A, while the isolation layers 406 will be patterned to form the isolation layers 106 as shown in FIG. 1A. The sacrificial layers 404 have sufficient etching selectivity with respect to the isolation layers 406, and the substrate 100 has sufficient etching selectivity with respect to the sacrificial layers 404 and the isolation layers 406. For instance, the isolation layers 406 may be formed of silicon oxide, while the sacrificial layers 404 may be formed of silicon nitride, and the substrate 100 may be formed of silicon carbide, silicon oxycarbide (SiOC), silicon oxycarbonitride (SiOCN), silicon carbonitride (SiCN) or the like. In some embodiments, the substrate 100, the sacrificial layers 404 and the isolation layers 406 are respectively formed by a deposition process, such as a chemical vapor deposition (CVD) process.

Figure 4B:
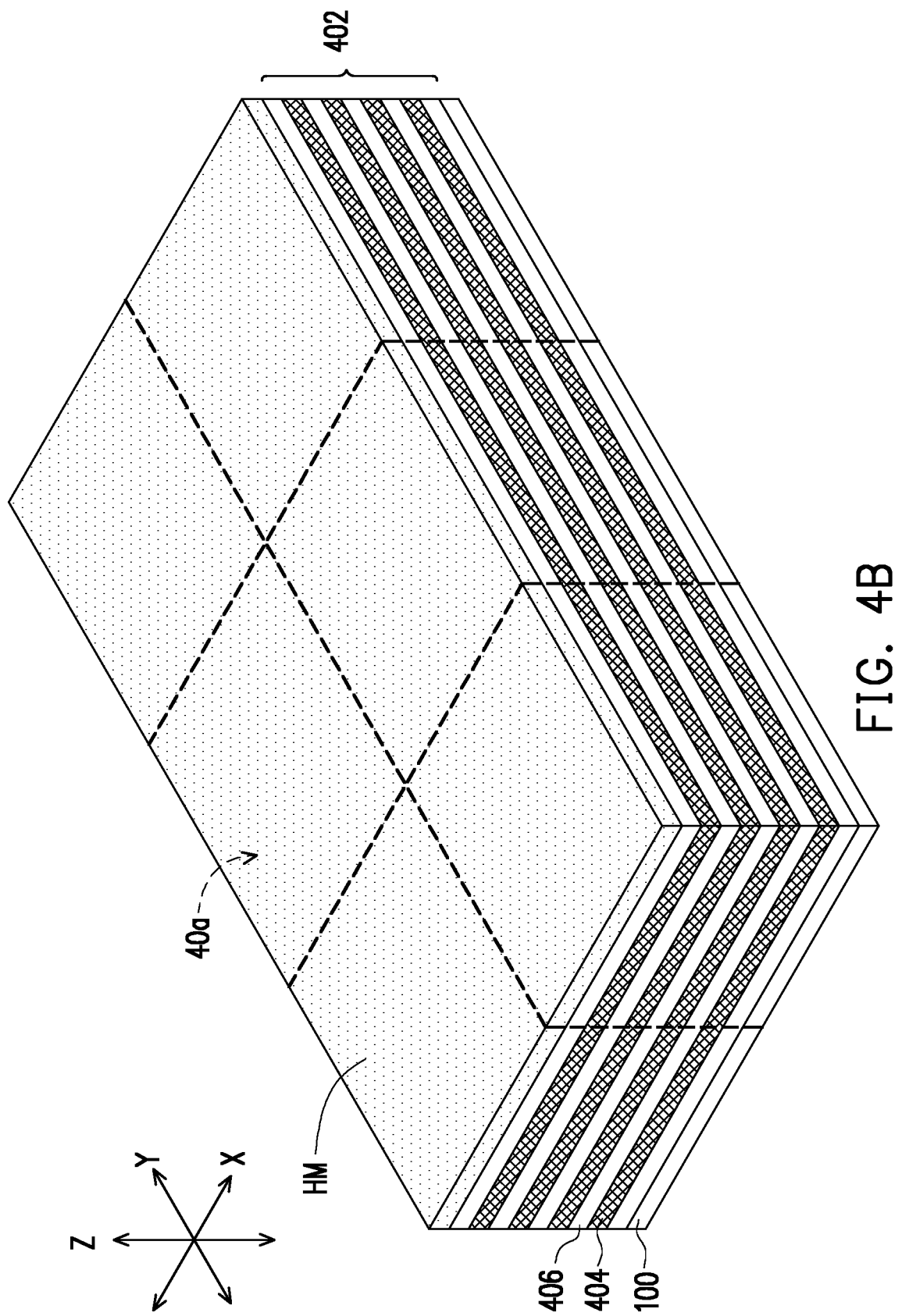
Figure 5B:
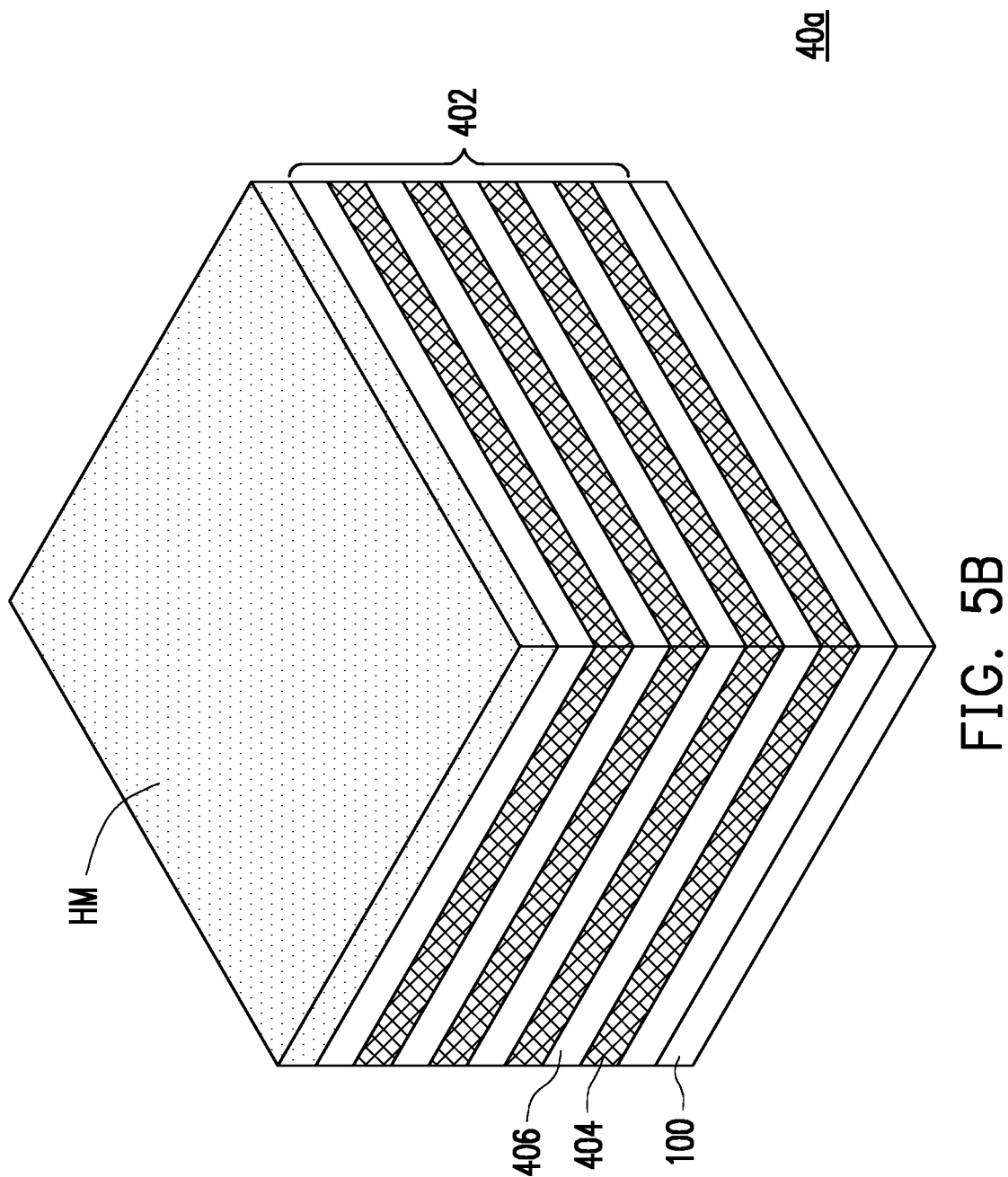

Referring to FIG. 3, FIG. 4B and FIG. 5B, step S102 is performed, and a hard mask layer HM is formed on the initial stacking structure 402. Currently, the hard mask layer HM may globally cover the initial stacking structure 402. The hard mask layer HM has sufficient etching selectivity with respect to the sacrificial layers 404 and the isolation layers 406. For instance, the hard mask layer HM may be formed of amorphous silicon, silicon carbide, silicon oxycarbide, silicon oxycarbonitride, silicon carbonitride, a high-k dielectric material (i.e., a dielectric material having dielectric constant (k) greater than 3.9, or greater than 7 or more) or the like. In some embodiments, the hard mask layer HM is formed by a deposition process, such as a CVD process.

Figure 4C:
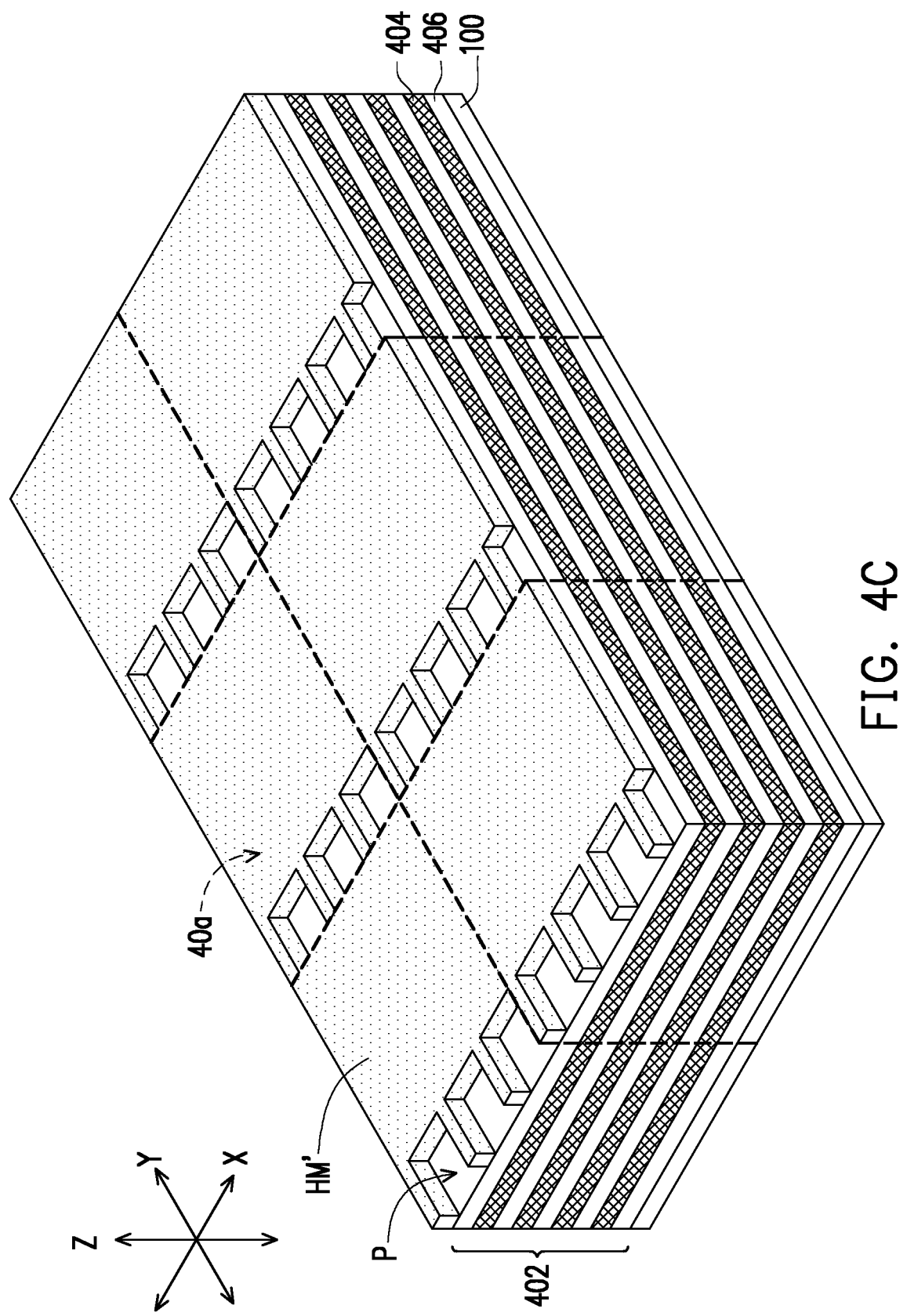
Figure 5C:
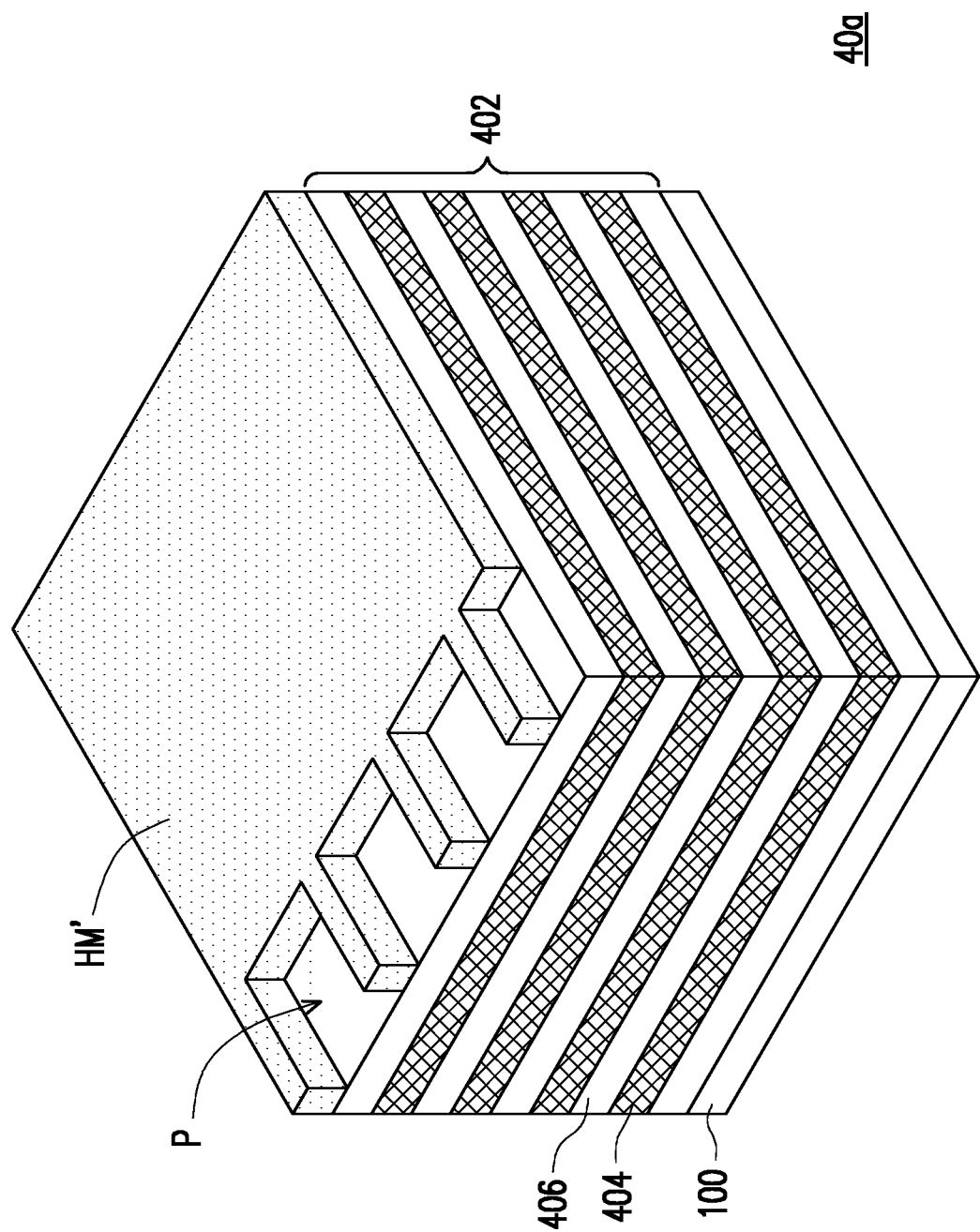

Referring to FIG. 3, FIG. 4C and FIG. 5C, step S104 is performed, and the hard mask layer HM is patterned to form a hard mask pattern HM'. The hard mask pattern HM' has openings P located at edge portions of the sub-array regions 40a, and portions of the topmost layer of the initial stacking structure 402 (e.g., one of the isolation layers 406) are exposed by the openings P. The openings P define locations of the staircase portions SP of the stacking structures 102 as described with reference to FIG. 1A and FIG. 1B. In some embodiments, the openings P are located at the same sides of the subs-array regions 40a. A method for patterning the hard mask layer HM to form the hard mask pattern HM' may include a lithography process and an etching process (e.g., an anisotropic etching process). Since the hard mask layer HM has sufficient etching selectivity with respect to the sacrificial layers 404 and the isolation layers 406, the sacrificial layers 404 and the isolation layers 406 may remain substantially intact during the etching process.

Figure 4D:
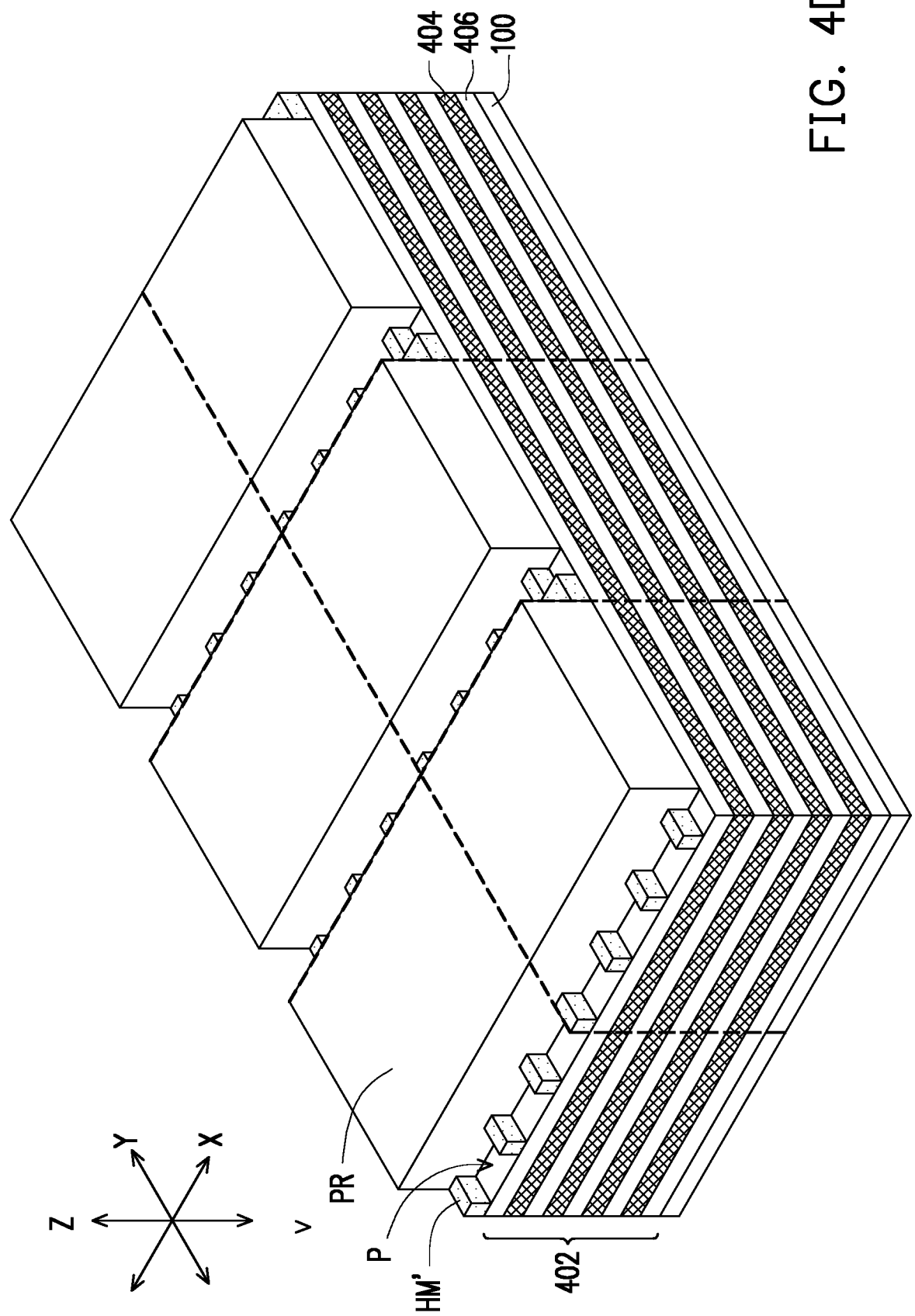
Figure 5D:
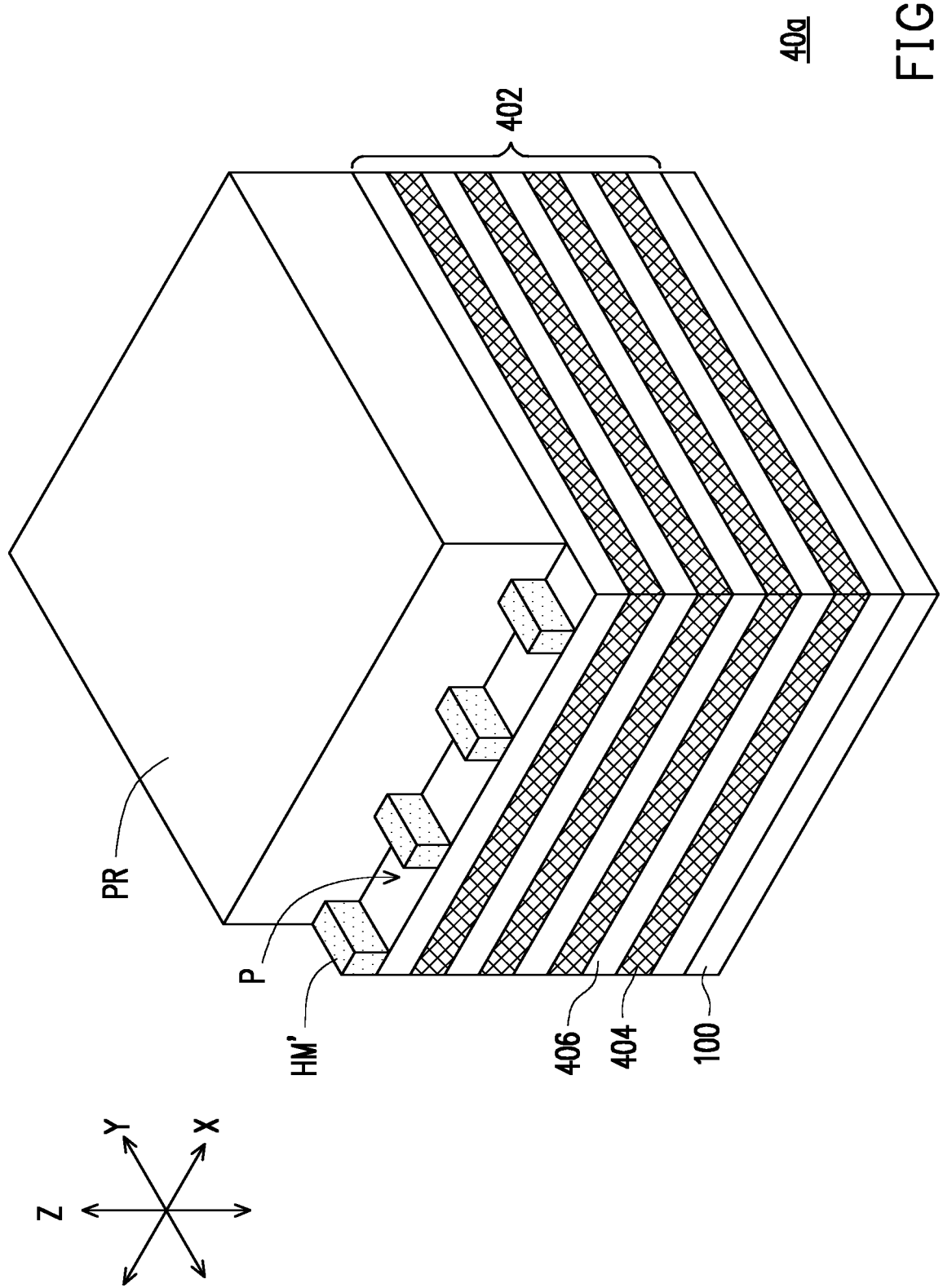

Referring to FIG. 3, FIG. 4D and FIG. 5D, step S106 is performed, and a photoresist pattern PR is formed on the mask pattern HM'. The photoresist pattern PR may have laterally separated portions, each covering a row of the sub-array regions 40a arranged along the direction X. Each of the separated portions of the photoresist pattern PR may be laterally recessed from an edge of a row of the sub-array regions 40a, at which the openings P of the hard mask pattern HM' are located. Accordingly, portions of the hard mask pattern HM' located between the openings P are partially exposed, so as the portions of the topmost layer of the initial stacking structure 402 overlapped with the openings P. The photoresist pattern PR may be formed of a photosensitive material, and a method for forming the photoresist pattern PR may include a lithography process.

Figure 4E:
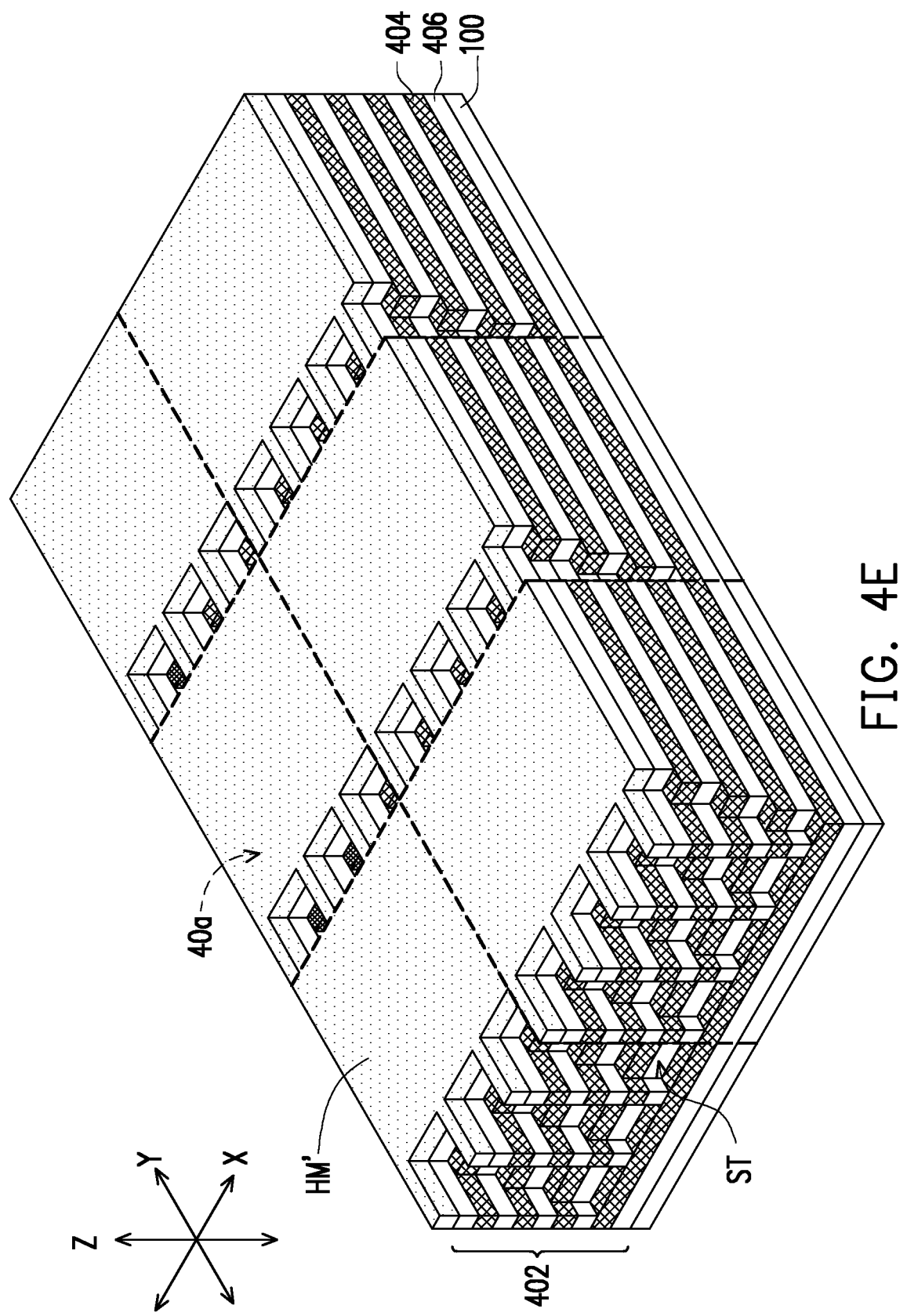
Figure 5E:
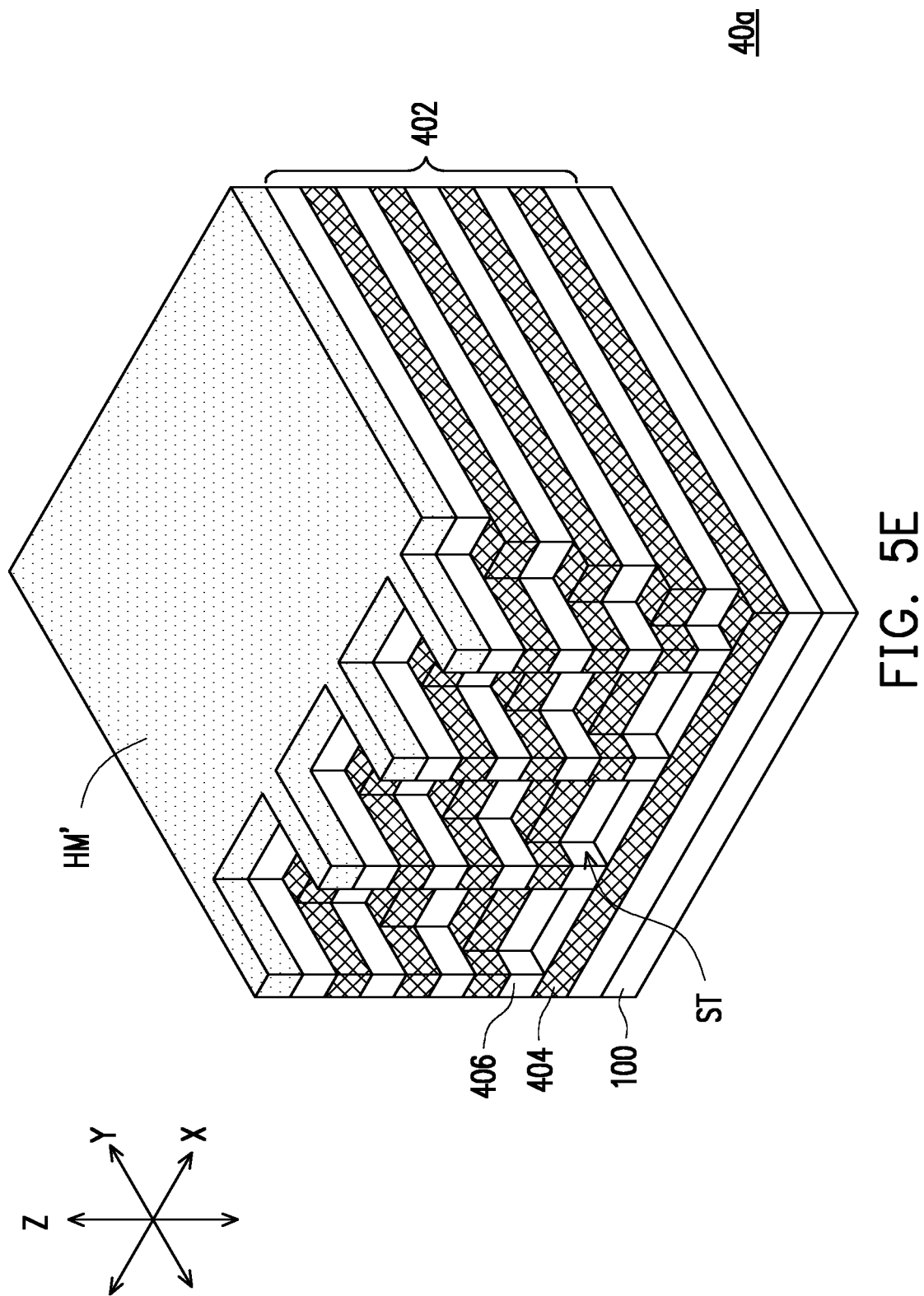

Referring to FIG. 3, FIG. 4E and FIG. 5E, step S108 is performed, and the portions of the initial stacking structure 402 overlapped with the openings P are respectively shaped into a staircase structure ST. In some embodiments, multiple trim-and-etch processes are performed to form the staircase structures ST, and the remained photoresist pattern PR is then removed. The trim-and-etch processes may include performing a first etching process on the exposed portions of the initial stacking structure 402 by using the photoresist pattern PR and the hard mask pattern HM' as shadow masks. Subsequently, the photoresist pattern PR is trimmed (further recessed from edges of the sub-array regions 40a), and a second etching process is performed by using the trimmed photoresist pattern PR and the hard mask pattern HM' as shadow masks. Thereafter, more of the trimming process and the etching process may be performed until the staircase structures ST are formed. After the staircase structures ST are formed, the remained photoresist pattern is removed by, for example, a stripping process or an ashing process. In each of the staircase structures ST, each sacrificial layer 404 and the underlying isolation layer 406 are laterally recessed from an underlying sacrificial layer 404 and the isolation layer 406 below this lower sacrificial layer 404. In those embodiments where the topmost sacrificial layer 404 is covered by a topmost isolation layer 406, the topmost isolation layer 406 in a staircase structure ST is laterally recessed from the topmost sacrificial layer 404 lying below the topmost isolation layer 406. On the other hand, other portions of the initial stacking structure 402 are remained covered by the hard mask pattern HM' having sufficient etching selectivity with respect to the materials in the initial stacking structure 402, thus these portions of the initial stacking structure 402 would not be shaped during formation of the staircase structures ST. Eventually, the hard mask pattern HM' may be removed by an additional etching process, such as an isotropic etching process.

Figure 4F:
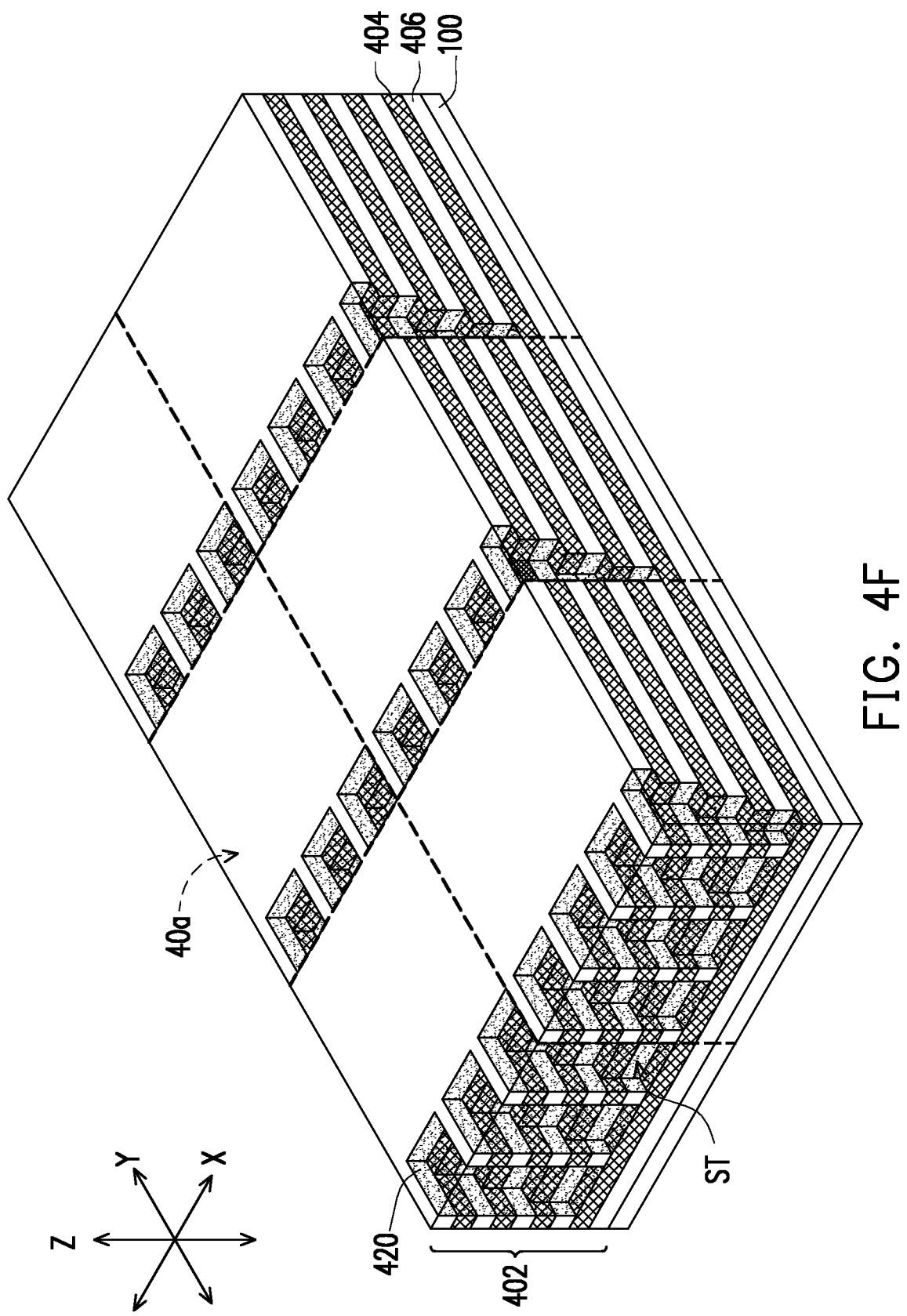
Figure 5F:
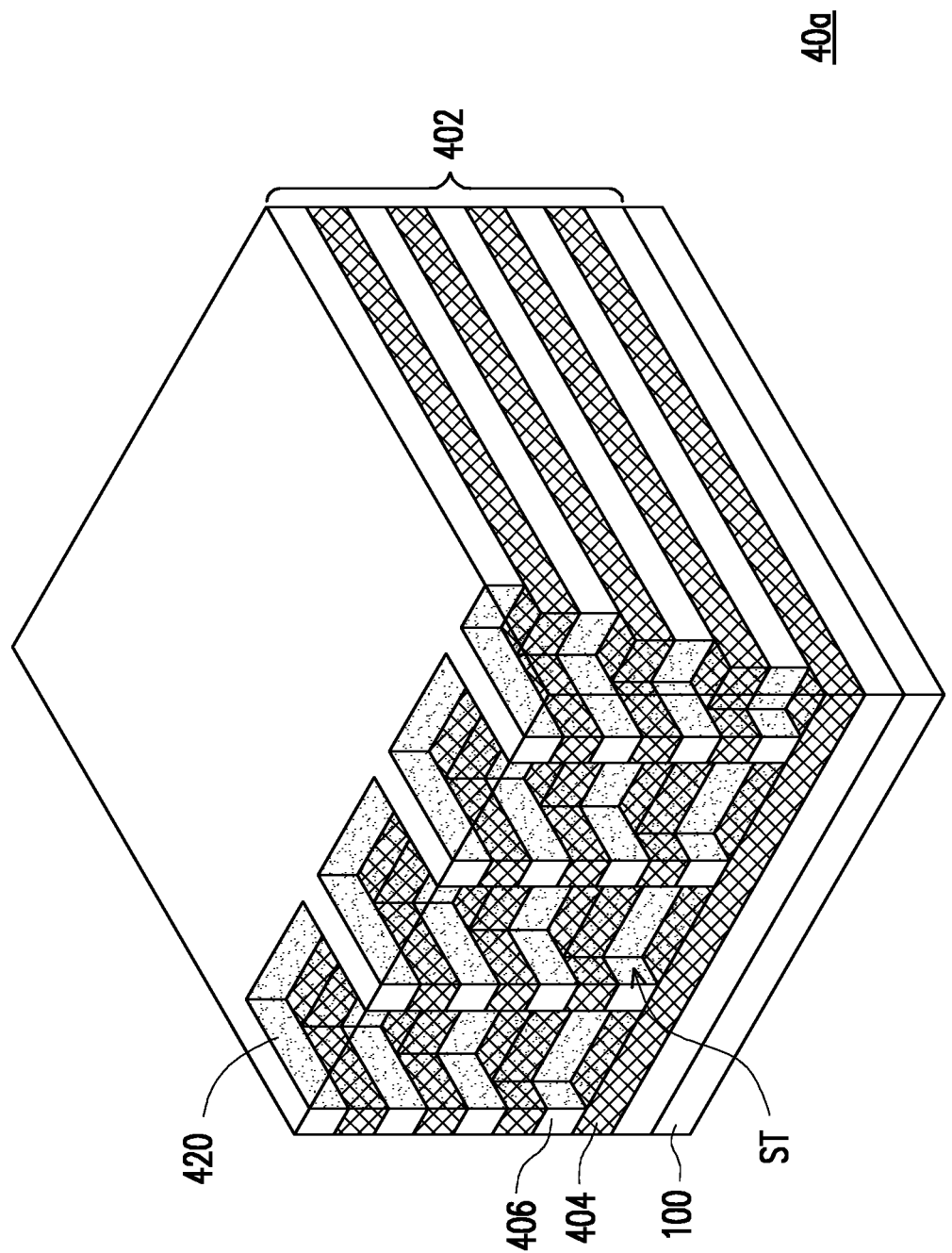

Referring to FIG. 3, FIG. 4F and FIG. 5F, step S110 is performed, and interlayer dielectric structures 420 are provided on the staircase structures ST. The interlayer dielectric structures 420 cover the steps of the staircase structures ST, and will be patterned to form the interlayer dielectric structures 120 as described with reference to FIG. 1A and FIG. 1B. In some embodiments, top surfaces of the insulating materials 420 are substantially coplanar with a topmost surface of the initial stacking structure 402. A method for forming the interlayer dielectric structures 420 may include providing an insulating material on the initial stacking structure 402 by a deposition process, such as a CVD process. The insulating material may cover the steps of the staircase structures ST and the topmost surface of the initial stacking structure 402. Subsequently, portions of the insulating material above the topmost surface of the initial stacking structure 402 are removed by a planarization process, and remained portions of the insulating material form the interlayer dielectric structures 420. For instance, the planarization process may include a polishing process, an etching process or a combination thereof.

Figure 4G:
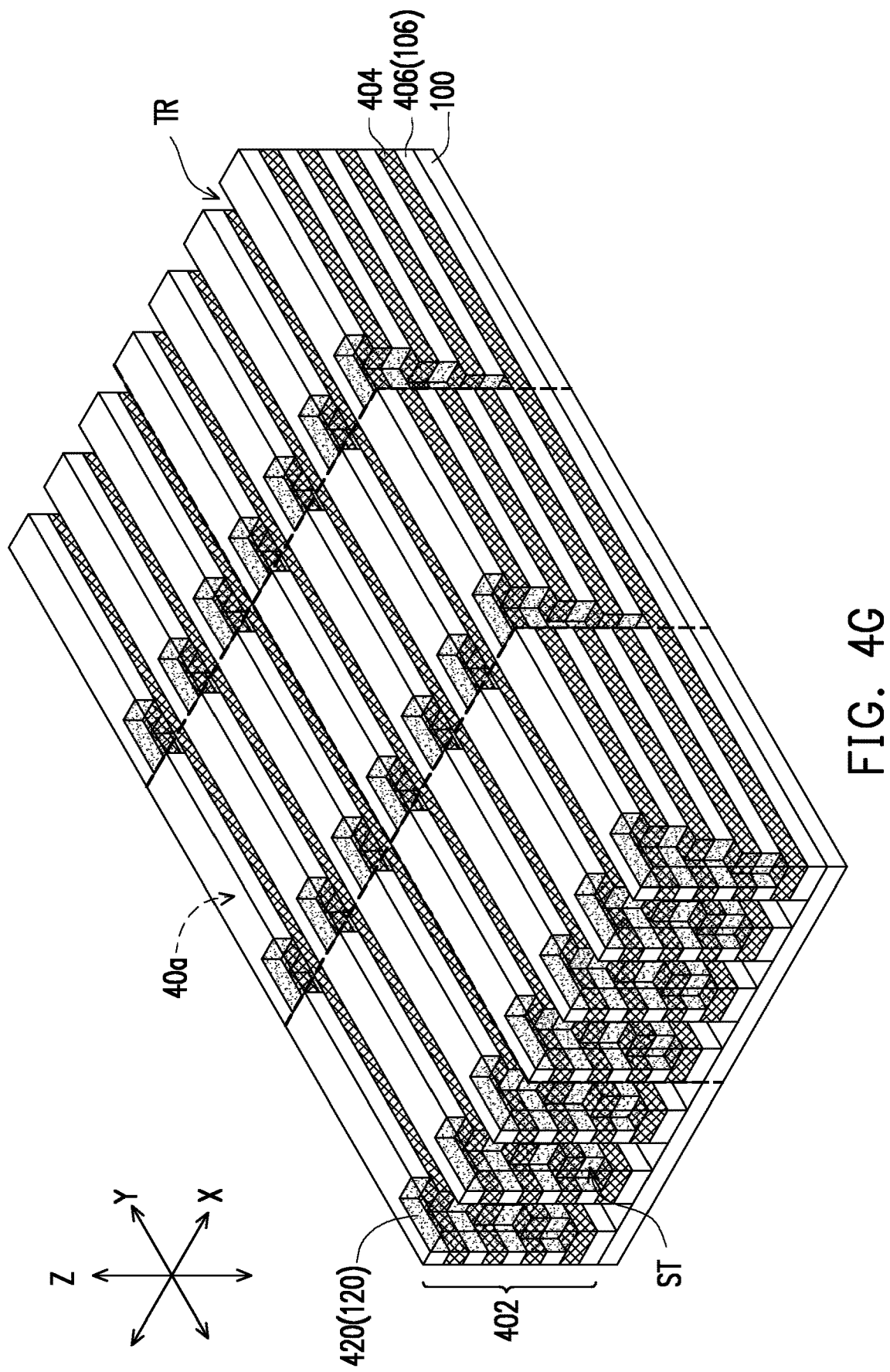
Figure 5G:
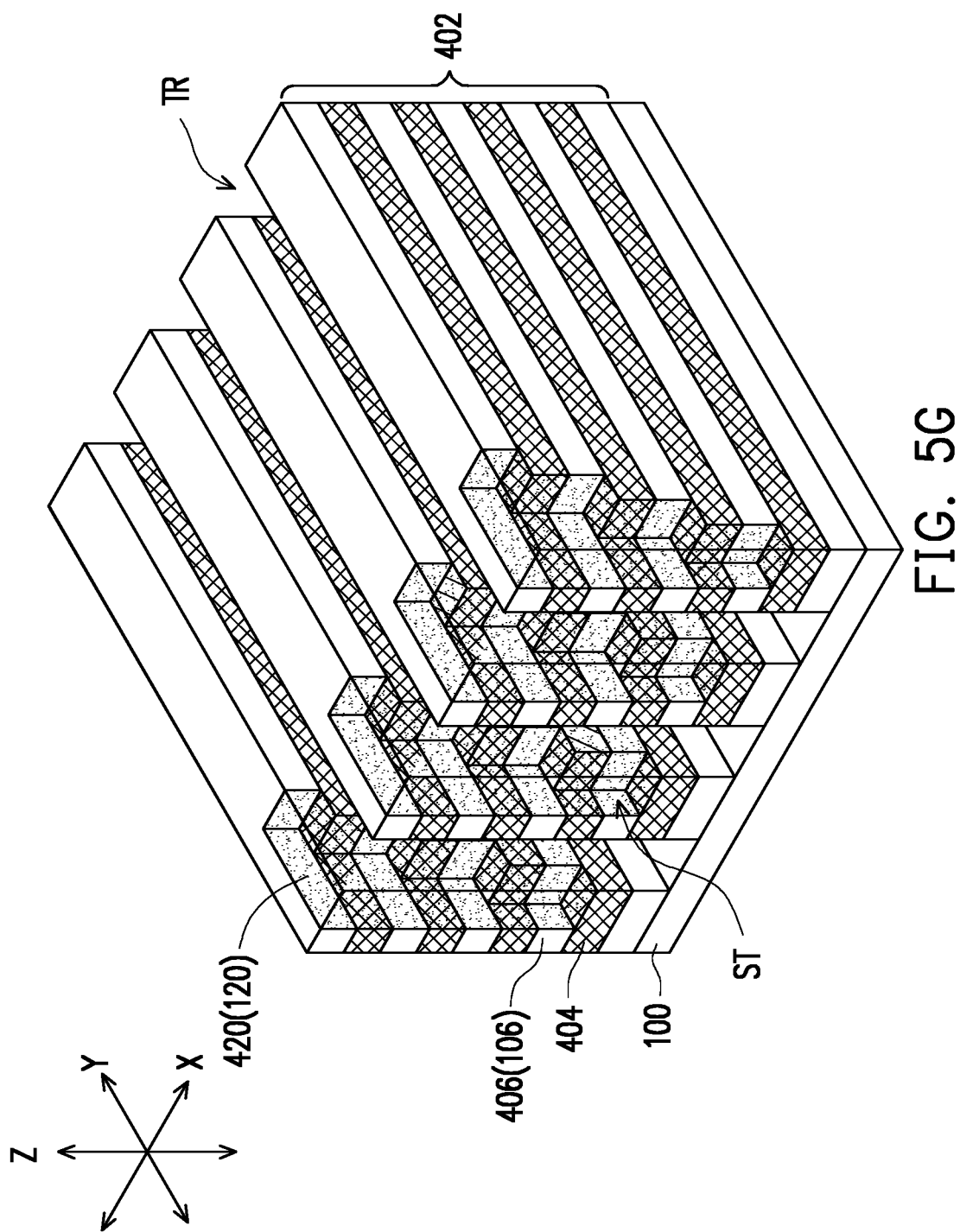

Referring to FIG. 3, FIG. 4G and FIG. 5G, step S112 is performed, and trenches TR are formed in the current structure. The trenches TR vertically penetrate through the initial stacking structure 402, and laterally extend through the staircase structures ST and some other portions of the initial stacking structure 402 along the direction Y. By forming the trenches TR, the initial stacking structure 402 are cut into laterally separated portions. The isolation layers 406 in these separated portions of the initial stacking structure 402 form the isolation layers 106 as described with reference to FIG. 1A and FIG. 1B, while the sacrificial layers 404 in these laterally separated portions of the initial stacking structure 402 will be replaced by the word lines 104 as described with reference to FIG. 1A and FIG. 1B. In addition, portions of the interlayer dielectric structures 420 are removed during formation of the trenches TR. The remained portions of the interlayer dielectric structures 420 form the interlayer dielectric structures 120 as described with reference to FIG. 1A and FIG. 1B. A method for forming the trenches TR may include at least one lithography process and an etching process (e.g., an anisotropic etching process).

Figure 4H:
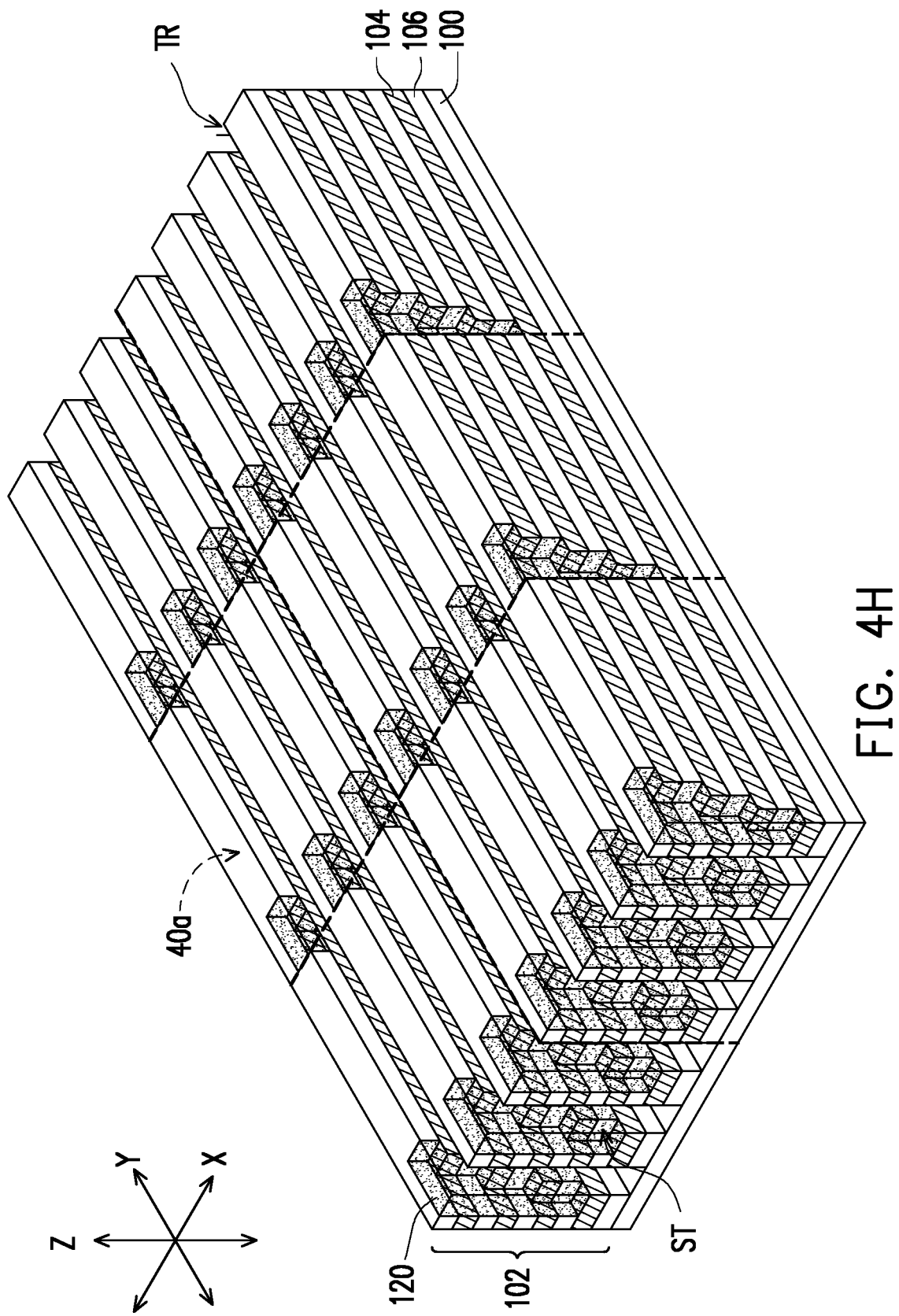
Figure 5H:
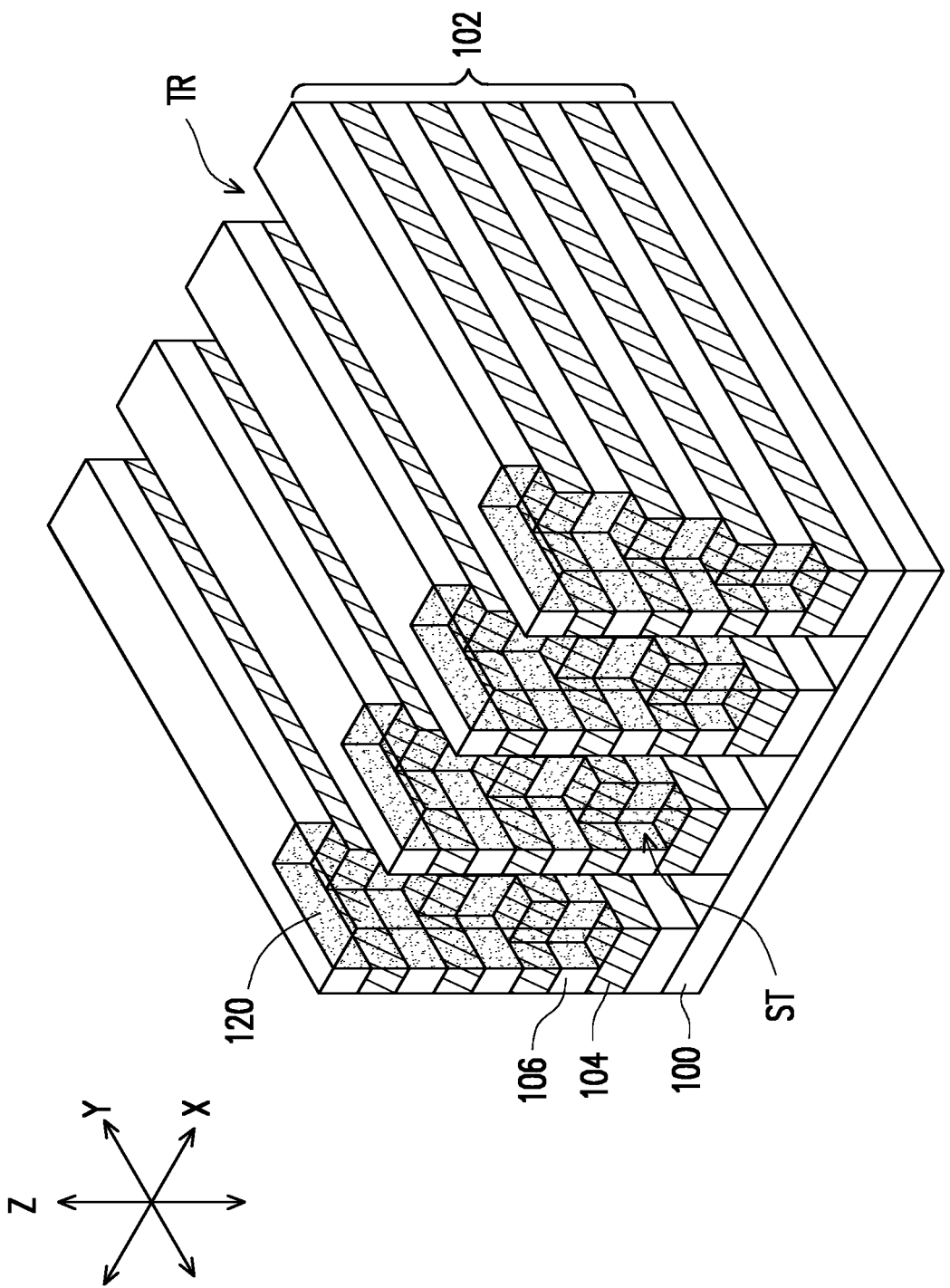

Referring to FIG. 3, FIG. 4H and FIG. 5H, step S114 is performed, and the sacrificial layers 404 are replaced by the word lines 104 as described with reference to FIG. 1A and FIG. 1B. By performing such replacement, the laterally separated portions of the initial stacking structure 420 become the stacking structures 102 as described with reference to FIG. 1A and FIG. 1B. In some embodiments, a method for replacing the sacrificial layers 404 with the word lines 104 include removing the sacrificial layers 404 by an isotropic etching process. The substrate 100, the isolation layers 106 and the interlayer dielectric structures 120 may have sufficient etching selectivity with respect to the sacrificial layers 404, thus may be substantially intact during the isotropic etching process. Further, the interlayer dielectric structures 120 may support the isolation layers 406 from collapse after removal of the sacrificial layers 404. Subsequently, a conductive material may be filled in the trenches TR and the space previously occupied by the sacrificial layers 404 by a deposition process (e.g., a CVD process or an atomic layer deposition (ALD) process). Thereafter, portions of the conductive material in the trenches TR are removed by an etching process, such as an anisotropic etching process. The remained portions of the conductive material are located at the space previously occupied by the sacrificial layers 404, and form the word lines 104. In addition, during such etching process, the isolation layers 106 and the interlayer dielectric structures 120 may be functioned as shadow masks.

Figure 4I:
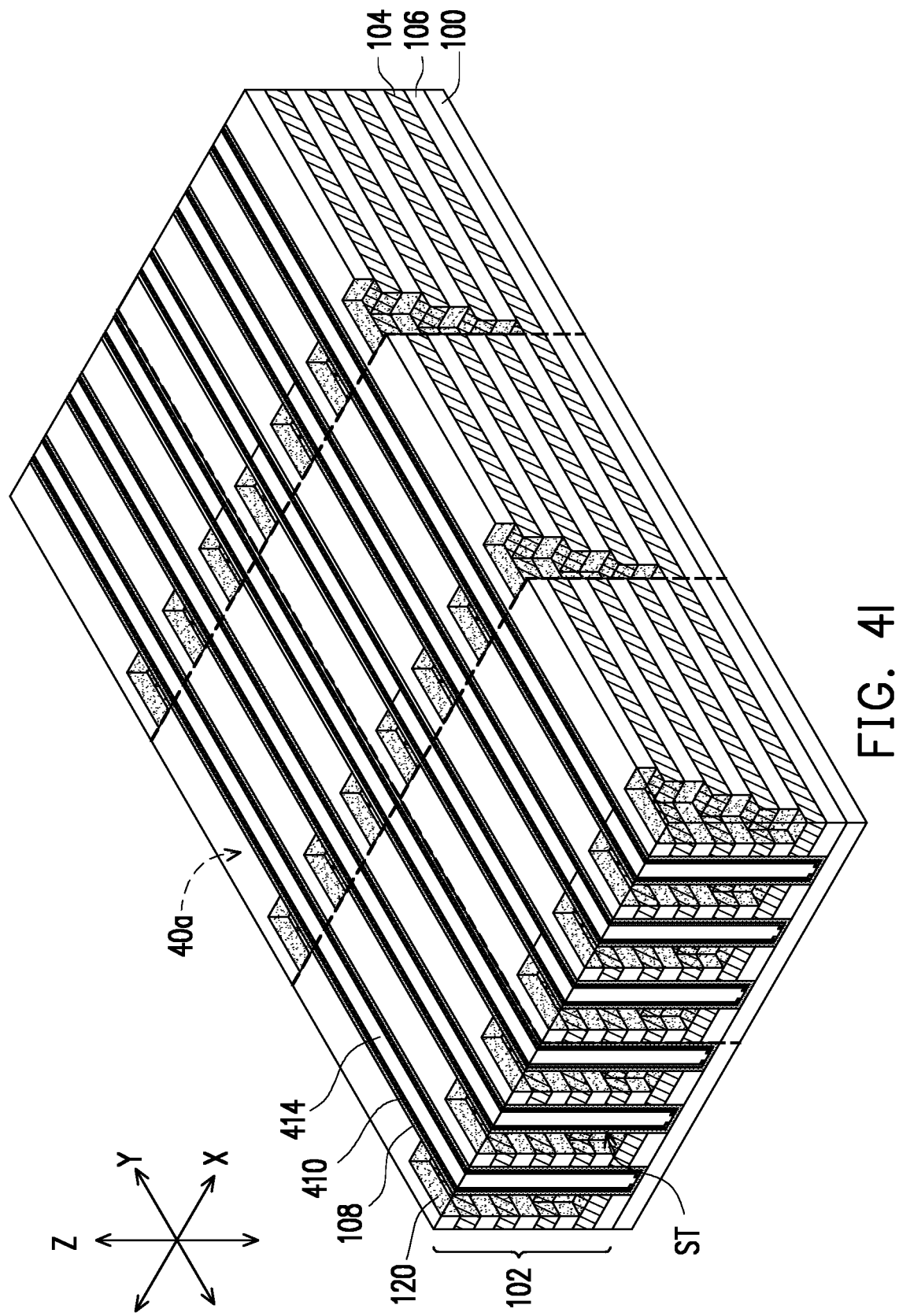
Figure 5I:
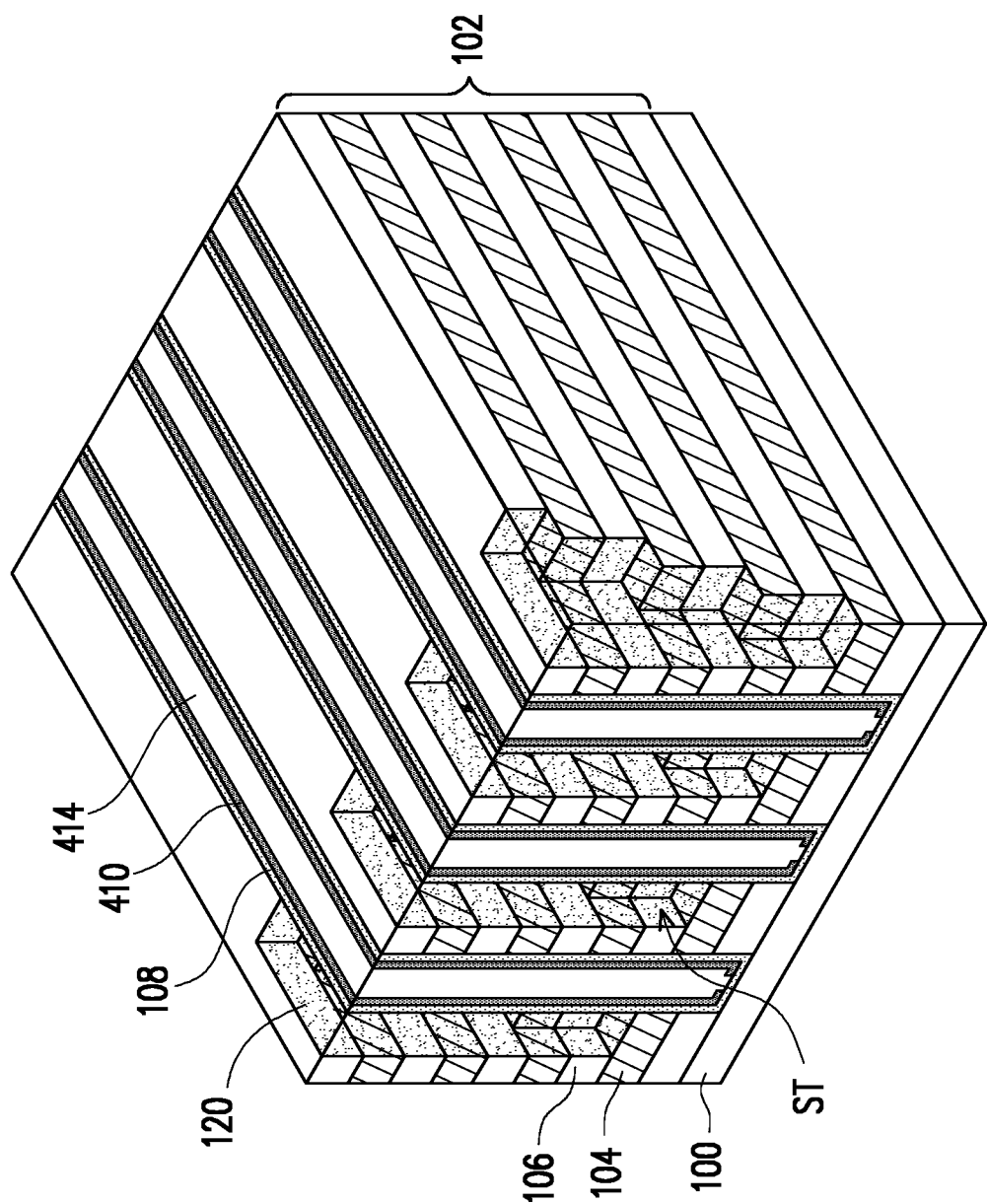

Referring to FIG. 3, FIG. 4I and FIG. 5I, step S116 is performed, and the switching layers 108, semiconductor layers 410 and insulating walls 414 are formed in the trenches TR. The semiconductor layers 410 will be patterned to form the channel layers 110 as described with reference to FIG. 1A and FIG. 1B, and the insulating walls 414 will be patterned to form the isolation structures 114 as described with reference to FIG. 1A and FIG. 1B. The switching layers 108 conformally cover surfaces of the trenches TR. Accordingly, the switching layers 108 respectively cover opposing sidewalls and a bottom surface of one of the trenches TR. The standing portions of the switching layers 108 laterally extend along the sidewalls of the trenches TR, while laterally extending portions of the switching layers 108 span on the bottom surfaces of the trenches TR. Each of the semiconductor layers 410 is located at an inner side of one of the switching layer 108, and covers opposing sidewalls of the standing portions of this switching layer 108. In some embodiments, the semiconductor layers 410 may also extend on the laterally extending portions of the switching layers 108, but adjacent semiconductor layers 410 in each trench TR may not in contact with each other. The insulating walls 414 stand in the trenches TR, and each of the semiconductor layers 410 is sandwiched between one of the switching layers 108 and one of the insulating walls 414. In some embodiments, a method for forming the switching layers 108, the semiconductor layers 410 and the insulating walls 414 includes sequentially forming a switching material layer and a semiconductor material layer globally and conformally covering the structure as shown in FIG. 4H. The switching material layer and the semiconductor material layer may respectively be formed by a deposition process, such as a CVD process or an ALD process. Subsequently, portions of the semiconductor material layer lying at bottoms of the trenches TR are at least partially removed by an etching process, such as an anisotropic etching process. During the etching process, portions of the semiconductor material layer above the stacking structures 102 may also be removed, and the remained portions of the semiconductor material layer may form the semiconductor layers 410. Thereafter, an insulating material is formed on the current structure by a deposition process, such as a CVD process. The insulating material fills up the trenches TR, and may further extend onto the stacking structures 102. Afterwards, portions of the insulating material above the stacking structures 102 as well as portions of the switching material layer above the stacking structures 102 are removed by a planarization process. The remained portions of the insulating material form the insulating walls 414, and the remained portions of the switching material layer form the switching layers 108. For instance, the planarization process may include a polishing process, an etching process or a combination thereof.

Figure 4J:
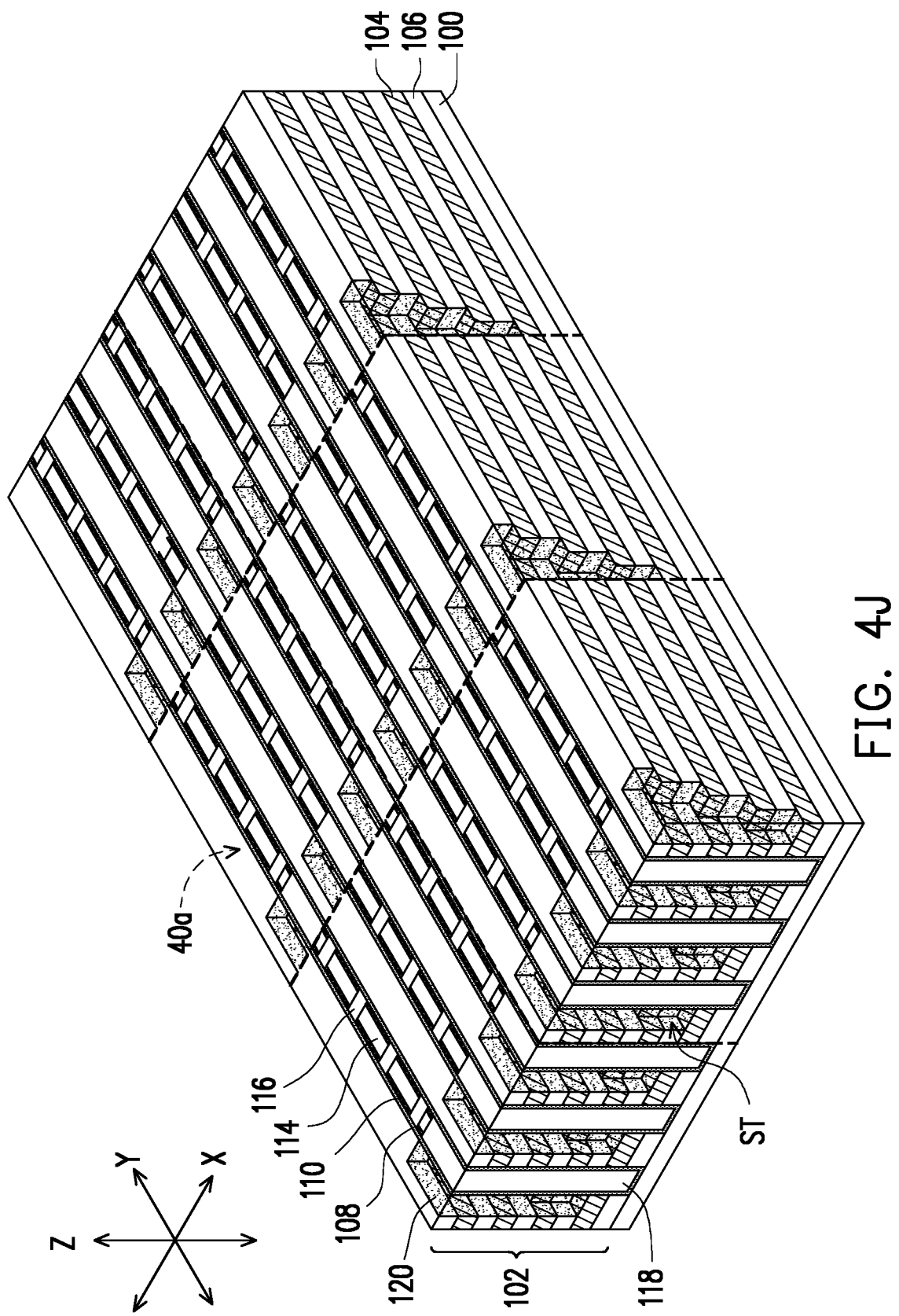
Figure 5J:
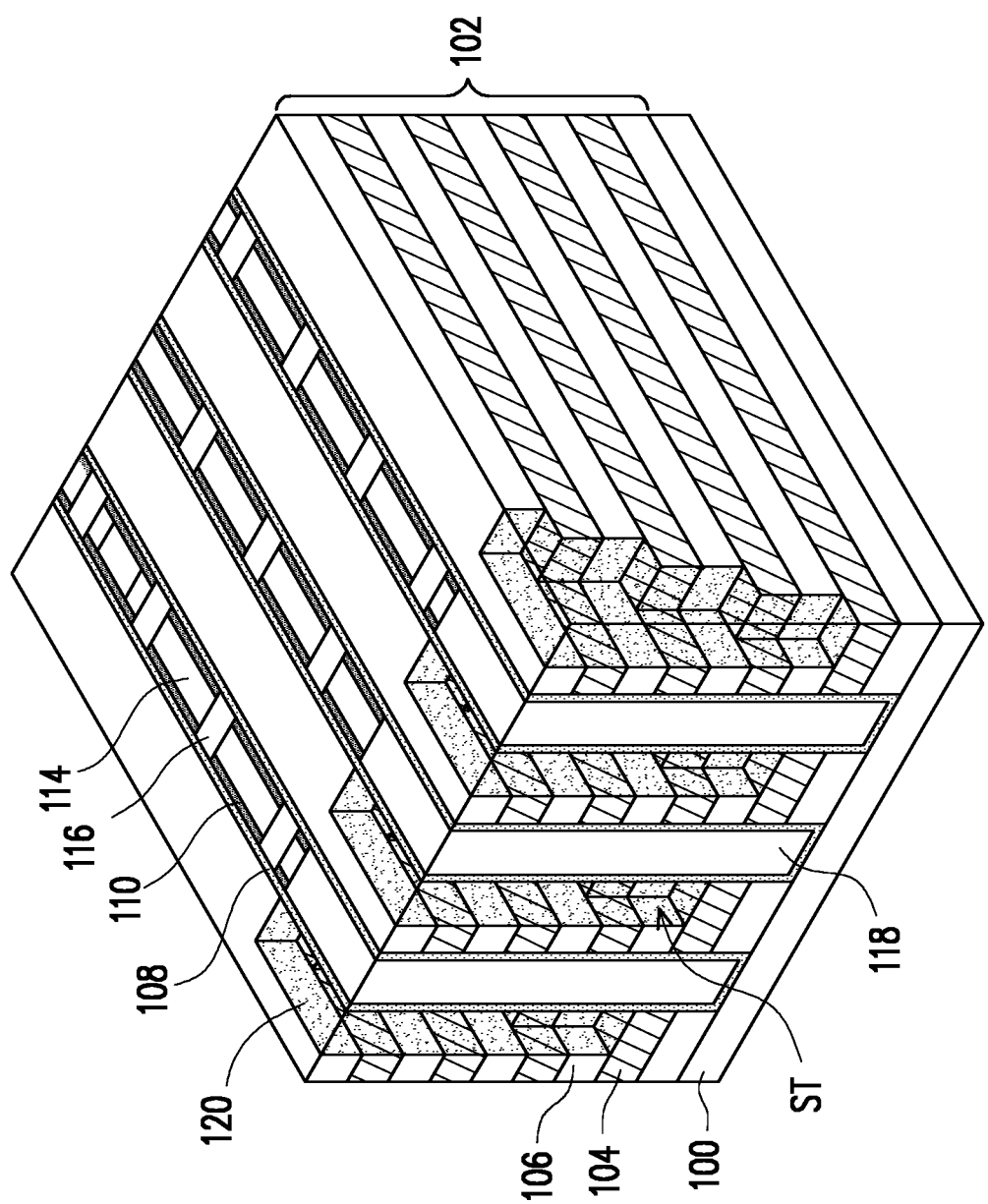
Figure 5J:
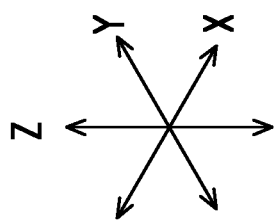

Referring to FIG. 3, FIG. 4J and FIG. 5J, step S118 is performed, such that the isolation pillars 116 and the insulating structures 118 as described with reference to FIG. 1A and FIG. 1B are formed. During formation of the isolation pillars 116 and the insulating structures 118, the insulating walls 414 are patterned to form the isolation structures 114 as described with reference to FIG. 1A and FIG. 1B, and the semiconductor layers 410 are patterned to form the channel layers 110 as described with reference to FIG. 1A and FIG. 1B. In some embodiments, a method for forming the isolation pillars 116 and the insulating structures 118 includes forming first and second openings in the insulating walls 414 by a lithography process and an etching process (e.g., an anisotropic etching process). The first openings will accommodate the isolation pillars 116, while the second openings will accommodate the insulating structures 118. During formation of the first and second openings, portions of the semiconductor layers 410 are removed, and the remained portions of the semiconductor layers 410 form the channel layers 110. Subsequently, an insulating material is filled into the first and second openings by a deposition process (e.g., a CVD process). Portions of the insulating material above the stacking structures 102 are then removed by a planarization process. The remained portions of the insulating material in the first openings form the isolation pillars 116, while the remained portions of the insulating material in the second openings form the insulating structures 118. For instance, the planarization process may include a polishing process, an etching process or a combination thereof.

Referring to FIG. 3, FIG. 1A and FIG. 1B, step S120 is performed, and the conductive pillars 112 are formed. Some portions of the isolation structures 114 are removed to form openings for accommodating the conductive pillars 112. In some embodiments, a method for forming the conductive pillars 112 includes forming the openings in the isolation structures 114 by a lithography process and an etching process (e.g., an anisotropic etching process). Subsequently, a conductive material is provided on the current structure by a deposition process (e.g., a physical vapor deposition (PVD) process or a CVD process), a plating process or a combination thereof. The conductive material may fill up the openings, and may further extend onto the stacking structures 102. Portions of the conductive material above the stacking structures 102 are then removed by a planarization process, and the remained portions of the conductive material form the conductive pillars 112. For instance, the planarization process may include a polishing process, an etching process or a combination thereof.

Up to here, the memory device 10 shown in FIG. 1A has been formed. Before formation of the memory device 10, preliminary process may be performed on the semiconductor substrate 200 as described with reference to FIG. 2A and FIG. 2B, to form the FEOL structure including the word line drivers WD as well as a portion of the BEOL structure including a lower portion of the word line routings WR. Moreover, after the formation of the memory device 10, further process may be performed to form upper portions of the word line routings WR above and penetrating through the memory device 10. In those embodiments where the source lines SL and the bit lines BL are disposed above the memory device 10, the source lines SL and the bit lines BL as well as possible vias (not shown) for connecting the source lines SL and the bit lines BL to the conductive pillars 112 are also formed after the formation of the memory device 10.

Figure 6A:
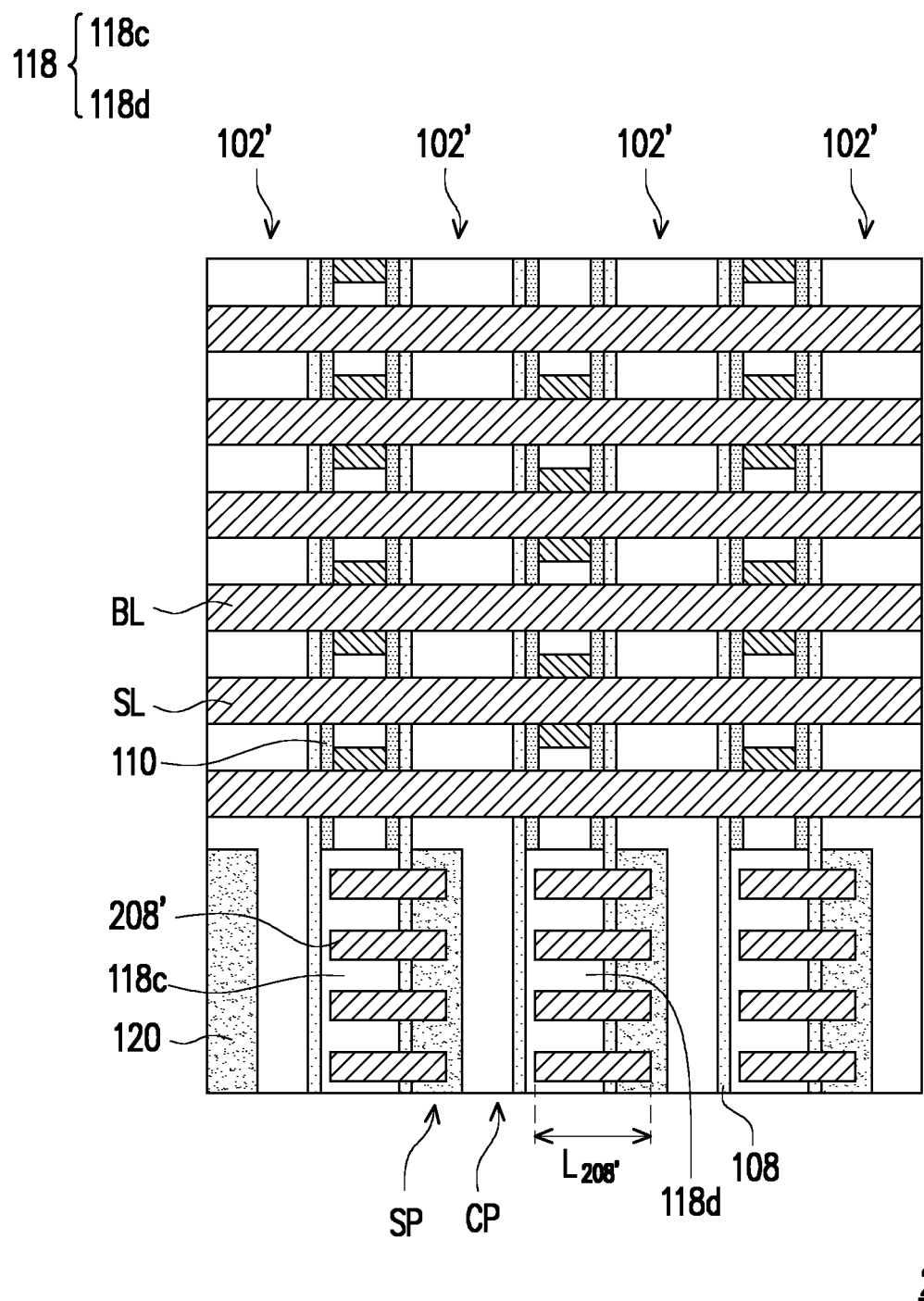
FIG. 6A is a schematic plan view illustrating a portion of a semiconductor device according to some embodiments of the present disclosure.
Figure 6B:
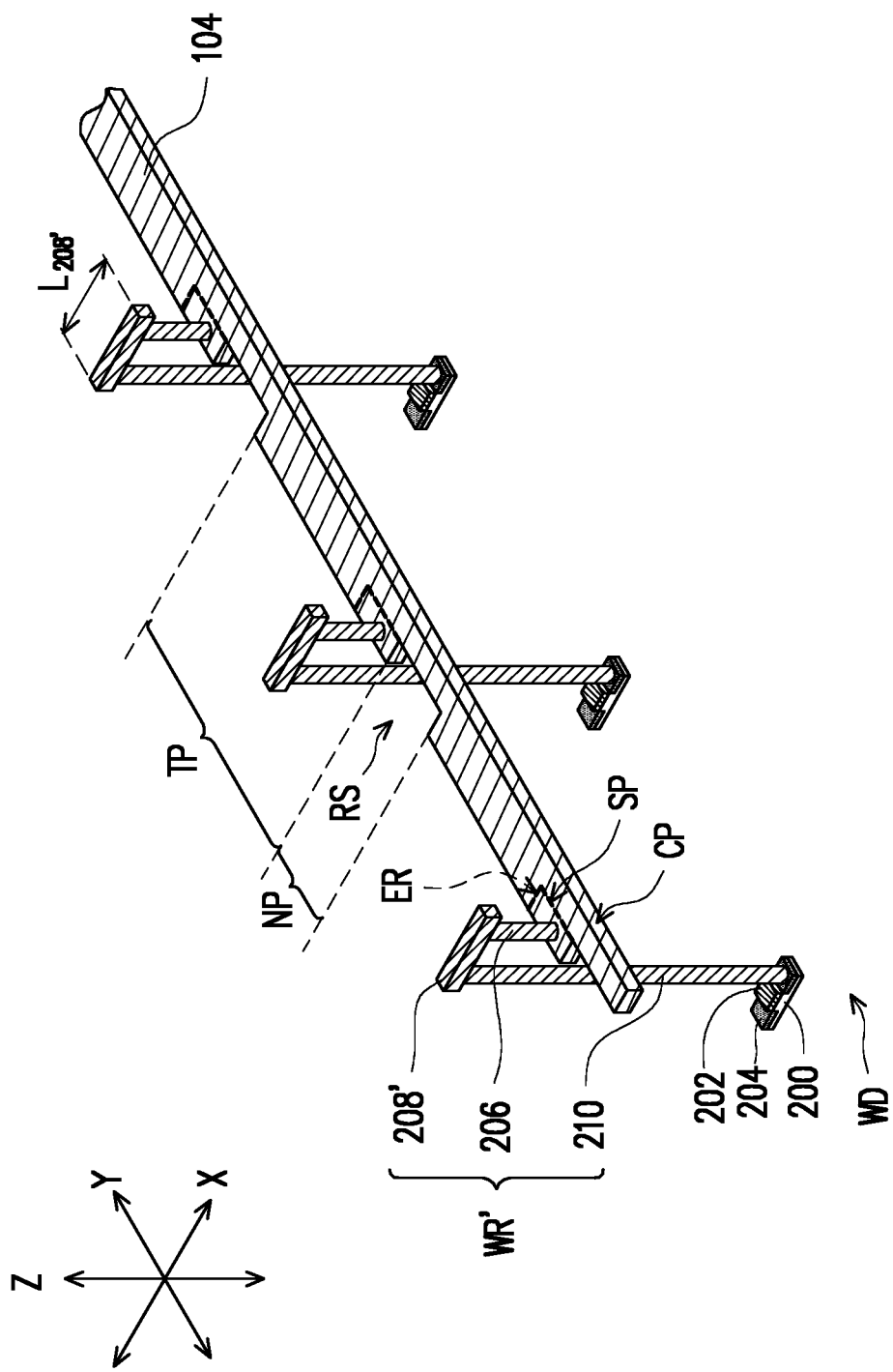
FIG. 6B is a schematic three-dimensional view illustrating one of the word lines as well as corresponding word line drivers and word line routings in the semiconductor device shown in FIG. 6A.

FIG. 6A is a schematic plan view illustrating a portion of a semiconductor device 20' according to some embodiments of the present disclosure. FIG. 6B is a schematic three-dimensional view illustrating one of the word lines 104 as well as corresponding word line drivers WD and word line routings WR' in the semiconductor device 20' shown in FIG. 6A. The semiconductor device 20' to be described with reference to FIG. 6A and FIG. 6B is similar to the semiconductor device 20 described with reference to FIG. 2A through FIG. 2C, thus only differences between the semiconductor devices 20, 20' will be discussed, and the same or the like parts will not be repeated again.

Referring to FIG. 2B and FIG. 6A, if the stacking structures 102 as shown in FIG. 2B are flipped horizontally, they would become stacking structures 102' as shown in FIG. 6A. In other words, if the staircase portions SP of the stacking structures 102 shown in FIG. 2B are at right sides of the stacking structures 102, the staircase portions SP of the stacking structures 102' shown in FIG. 6A would be at left sides of the stacking structures 102'. As shown in FIG. 6A, one of the staircase portions SP in the corresponding stacking structure 102' extends along the direction Y and between two of the insulating structures 118. One of these insulating structures 118 is closer to this staircase portion SP of the corresponding stacking structure 102' than the other. The relatively distant insulating structure 118d is laterally spaced apart from this staircase portion SP of the stacking structure 102' with a connection portion CP of this stacking structure 102' in between, while the relatively close insulating structure 118c is laterally spaced apart from this staircase portion SP of the stacking structure 102' without a connection portion of this stacking structure 202 in between. As shown in FIG. 6A and FIG. 6B, in some embodiments, word line routings WR' respectively extend from one of the staircase portions SP in the corresponding stacking structure 102' to the underlying word line driver WD (as described with reference to FIG. 2B and FIG. 2C) through the said relatively close insulating structure 118c. In these embodiments, a length $L_{208'}$ of a conductive traces 208' in the word line routings WR' may be reduced, and a routing path from the word lines 104 to the word line drivers WD can be shortened.

Figure 7A:
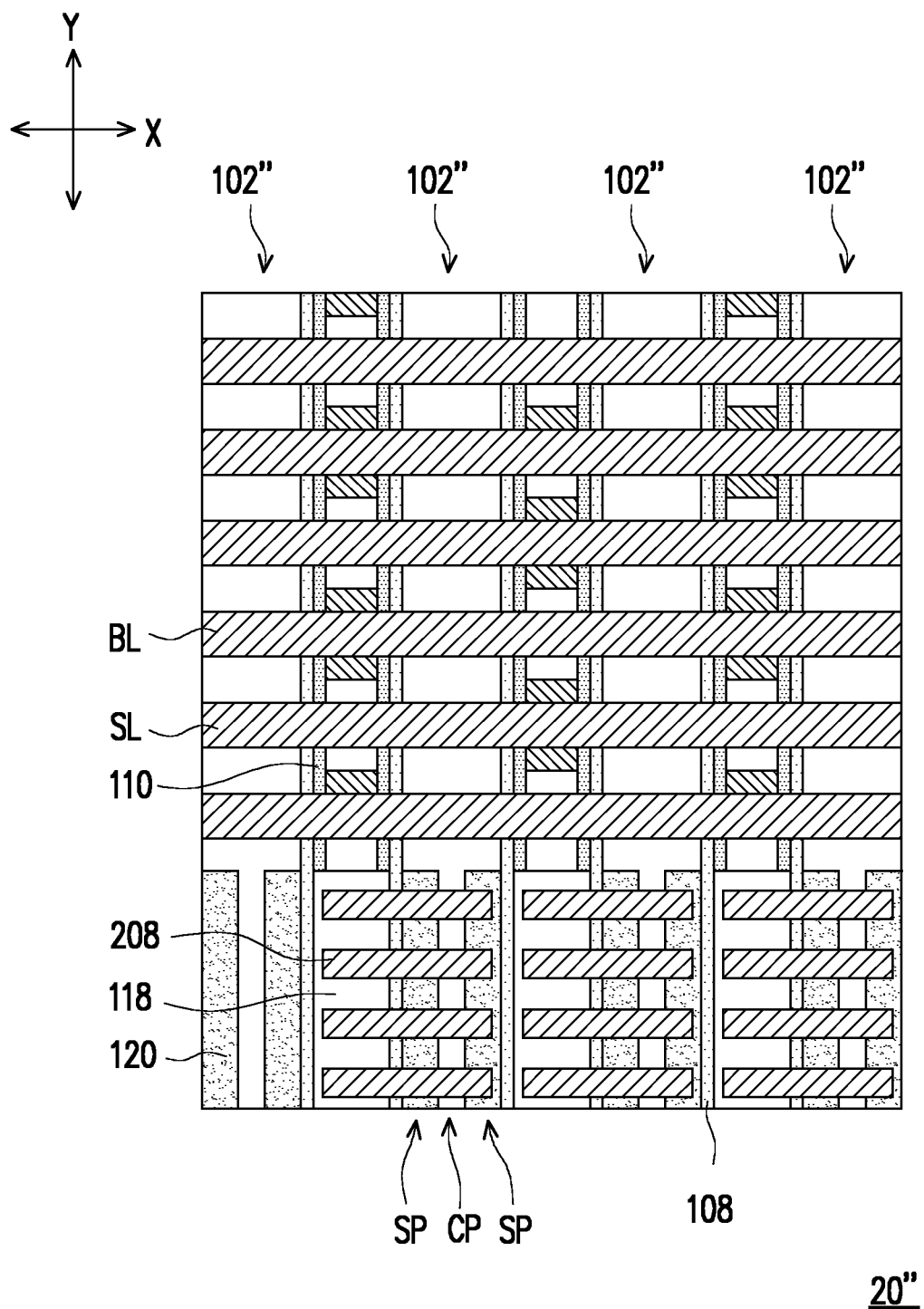
FIG. 7A is a schematic plan view illustrating a portion of a semiconductor device according to some embodiments of the present disclosure.
Figure 7B:
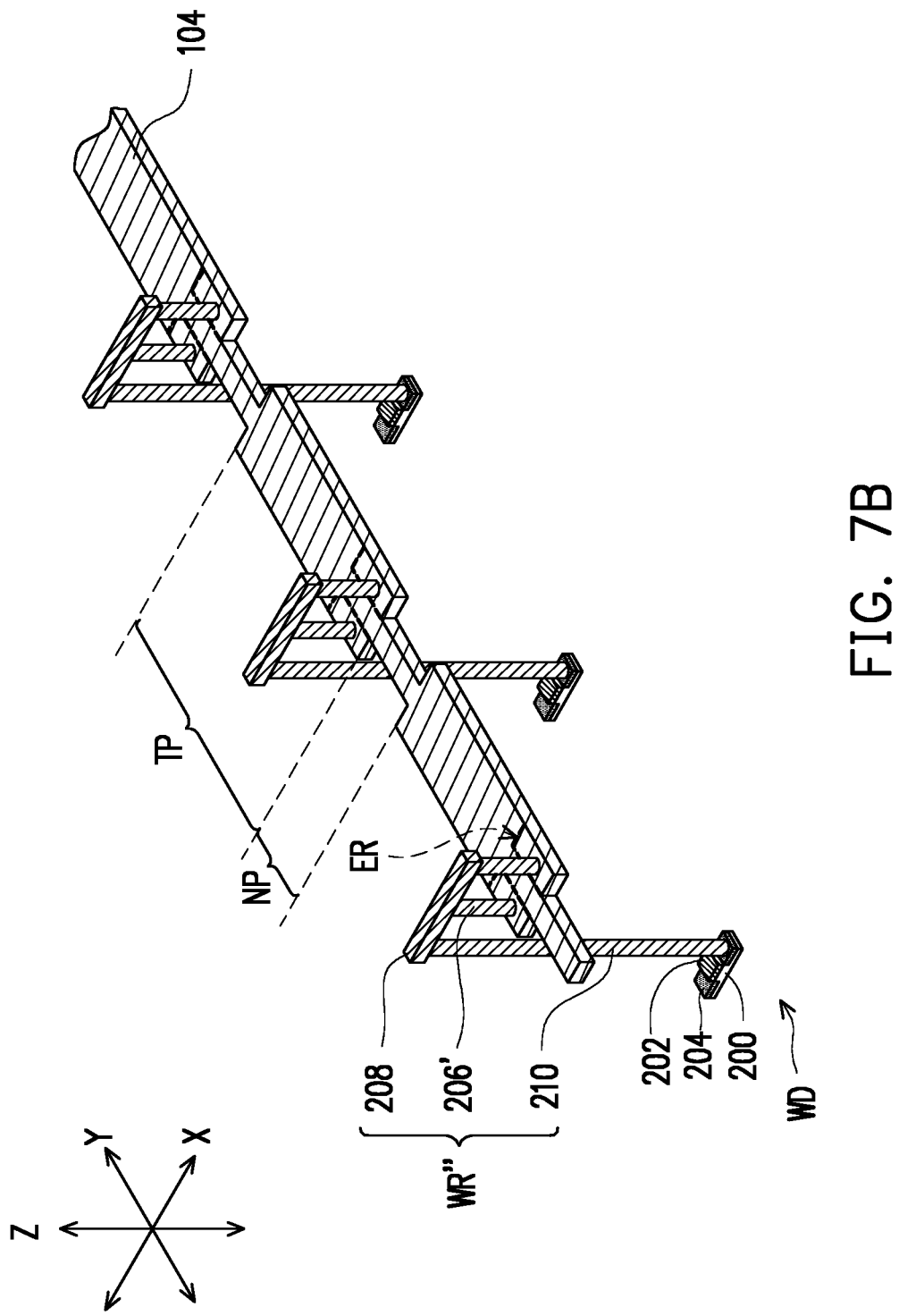
FIG. 7B is a schematic three-dimensional view illustrating one of the word lines as well as corresponding word line drivers and word line routings in the semiconductor device shown in FIG. 7A.

FIG. 7A is a schematic plan view illustrating a portion of a semiconductor device 20" according to some embodiments of the present disclosure. FIG. 7B is a schematic three-dimensional view illustrating one of the word lines 104 as well as corresponding word line drivers WD and word line routings WR" in the semiconductor device 20" shown in FIG. 7A. The semiconductor device 20" to be described with reference to FIG. 7A and FIG. 7B is similar to the semiconductor device 20 described with reference to FIG. 2A through FIG. 2C, thus only differences between the semiconductor devices 20, 20" will be discussed, and the same or the like parts will not be repeated again.

Referring to FIG. 7A and FIG. 7B, in some embodiments, each connection portion CP in a corresponding stacking structure 102" extends between two staircase portions SP of this stacking structure 102". The staircase portions SP at opposite sides of the connection portion CP may have substantially identical footprint area. Alternatively, one of these staircase portions SP may have a footprint area greater than a footprint of the other staircase portion SP. As shown in FIG. 7B, the staircase portions SP at opposite sides of the connection portion CP are respectively out-routed, and may be connected to the same transistor of the word line drivers WD. In some embodiments, word line routings WR" include conductive vias 206', the conductive traces 208 and the through vias 210. Two of the conductive vias 206' stand on the steps in the staircase portions SP at opposite sides of one of the connection portions CP. These steps are at the same level, thus are formed by shaping the same word line 104. One of the conductive traces 208 extends over these two conductive vias 206', and is electrically connected to these two conductive vias 206'. In addition, one of the through vias 210 connects this conductive trace 208 to the corresponding transistor of the word line drivers WD.

Figure 8:
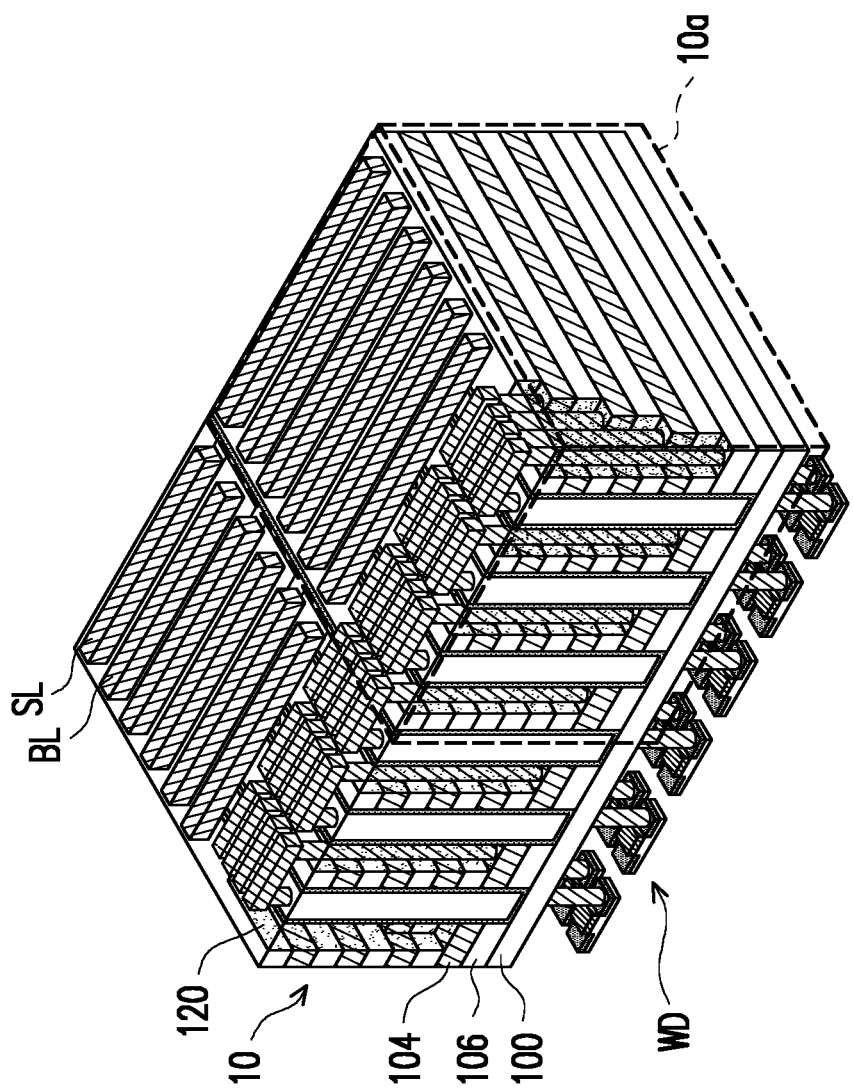
FIG. 8 is a schematic three-dimensional view illustrating a portion of a semiconductor device according to some embodiments of the present disclosure.

FIG. 8 is a schematic three-dimensional view illustrating a portion of a semiconductor device 20-1 according to some embodiments of the present disclosure. The semiconductor device 20-1 to be described with reference to FIG. 8 is similar to the semiconductor device 20 as described with reference to FIG. 2A, thus only differences between the semiconductor devices 20, 20-1 will be discussed, and the same or the like parts will not be repeated again.

Referring to FIG. 2A, the source lines SL and the bit lines BL connected to a first one of the sub-arrays 10a are offset from the source lines SL and the bit lines BL connected to a second one of the sub-arrays 10a along the direction Y. The first and second sub-arrays 10a are adjacent with each other, and arranged along the direction X. On the other hand, as shown in FIG. 8, the source lines SL and the bit lines BL connected to a first sub-array 10a are aligned with the source lines SL and the bit lines BL connected to a second sub-array 10a, which is adjacent to the first sub-array 10a along the direction X.

As above, the memory cells in the memory device are stackable, thus the memory device is no longer limited by two-dimensional design, and a storage density of the memory device may be significantly increased. Further, instead of being cut off at interface between adjacent sub-arrays in the same column, the word lines according to the present disclosure continuously extend through adjacent sub-arrays in the same column. Consequently, smaller driving current is required for driving the word lines. Therefore, dimensions of the word line drivers can be further scaled, and more active devices and/or passive devices can be integrated in the FEOL structure of the semiconductor device. Otherwise, if the dimensions of the word line drivers are not further scaled, driving ability of the word line drivers can be equivalently improved.

In an aspect of the present disclosure, a memory device is provided. The memory device comprises: a stacking structure, comprising isolation layers and word lines alternately stacked on a substrate, and extending along a first direction, wherein the stacking structure has a staircase portion and a connection portion at an edge region of the stacking structure, each of the word lines is laterally recessed from an underlying one of the word lines in the staircase portion, the connection portion extends along the staircase portion and located aside the staircase portion, and the word lines and the isolation layers in the connection portion have substantially identical length along the first direction; a switching layer, covering a sidewall of the stacking structure; first channel layers, covering a sidewall of the switching layer that is facing away from the stacking structure, and laterally spaced apart from one another along the first direction; and pairs of conductive pillars, standing on the substrate and in lateral contact with the switching layer through the first channel layers, wherein the conductive pillars of each pair are laterally separated from each other along the first direction, and adjacent pairs of the conductive pillars are laterally separated along the first direction as well.

In another aspect of the present disclosure, a memory device is provided. The memory device comprises: a stacking structure, comprising isolation layers and word lines alternately stacked on a substrate, and extending along a first direction, wherein the stacking structure has staircase portions separately arranged along the first direction, each of the staircase portions has a width along a second direction intersected with the first direction, and the width of each staircase portion is less than a total width of the stacking structure along the second direction; a switching layer, covering a sidewall of the stacking structure; first channel layers, covering a sidewall of the switching layer that is facing away from the stacking structure, and laterally spaced apart from one another along the first direction; and pairs of conductive pillars, standing on the substrate and in lateral contact with the switching layer through the first channel layers, wherein the conductive pillars of each pair are laterally separated from each other along the first direction, and adjacent pairs of the conductive pillars are laterally separated along the first direction as well.

In yet another aspect of the present disclosure, a semiconductor device is provided. The semiconductor device comprises: a substrate; a stacking structure, comprising isolation layers and word lines alternately stacked on the substrate, and extending along a first direction, wherein the stacking structure has a staircase portion and a connection portion at an edge region of the stacking structure, the connection portion extends along the staircase portion, and is in lateral contact with the staircase portion; a switching layer, covering a sidewall of the stacking structure; channel layers, covering a sidewall of the switching layer that is facing away from the stacking structure, and laterally spaced apart from one another along the first direction; pairs of conductive pillars, standing on the substrate and in lateral contact with the switching layer through the channel layers, wherein the conductive pillars of each pair are laterally separated from each other along the first direction, and adjacent pairs of the conductive pillars are laterally separated along the first direction as well; word line drivers, disposed below the substrate; and word line routings, extending from steps of the staircase portion of the stacking structure to the word line drivers through the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
    providing a stacking structure in line shape on a substrate, wherein the stacking structure comprises alternately stacked isolation layers and sacrificial layers;
    patterning an end section of the stacking structure, such that the end section is shaped to have a staircase portion and a connection portion aside the staircase portion, wherein the isolation layers and the sacrificial layers in the connection portion respectively extend to an edge of the stacking structure to which a bottommost step of the staircase portion reaches;
    replacing the sacrificial layers with word lines;
    forming a switching layer along a sidewall of the stacking structure;
    forming channel layers separately in lateral contact with the stacking structure through the switching layer; and
    forming pairs of conductive pillars aside the stacking structure, wherein the conductive pillars of each pair are separately in lateral contact with the stacking structure through one of the channel layers and the switching layer.

2. The method for manufacturing the memory device according to claim 1, wherein a width of the staircase portion along a lateral direction perpendicular to an extending direction of the stacking structure in line shape is shorter than a total width of the stacking structure along the lateral direction.

3. The method for manufacturing the memory device according to claim 2, wherein the total width of the stacking structure is substantially equal to a summation of the width of the staircase portion and a width of the connection portion along the lateral direction.

4. The method for manufacturing the memory device according to claim 1, wherein
    the isolation layers and the sacrificial layers in the connection portion of the stacking structure have substantially identical length along an extending direction of the stacking structure in line shape.

5. The method for manufacturing the memory device according to claim 1, further comprising:
    covering the staircase portion of the stacking structure with an interlayer dielectric structure before replacing the sacrificial layers with the word lines.

6. The method for manufacturing the memory device according to claim 1, wherein the switching layer is formed of a ferroelectric material.

7. The method for manufacturing the memory device according to claim 1, further comprising:
    forming isolation structures respectively in between the conductive pillars of each pair; and
    forming isolation pillars respectively in between adjacent pairs of the conductive pillars.

8. The method for manufacturing the memory device according to claim 1, further comprising:
    forming an insulating structure in lateral contact with the section of the stacking structure through the switching layer.

9. The method for manufacturing the memory device according to claim 1, further comprising:
    forming conductive vias on steps of the staircase portion of the stacking structure that are defined by the word lines.

10. A method for manufacturing a memory device, comprising:
    forming stacking structures in line shape on a substrate provided over word line drivers, wherein the stacking structures respectively comprise alternately stacked isolation layers and sacrificial layers;
    patterning an end section of each stacking structure, such that the end section of each stacking structure is shaped to have a staircase portion and a connection portion aside the staircase portion, wherein the connection portions extend to edges of the stacking structures to which bottommost steps of the staircase portions reach;
    replacing the sacrificial layers with word lines;
    forming switching layers along sidewalls of the stacking structures;
    forming channel layers separately in lateral contact with the stacking structures through the switching layers;
    forming pairs of conductive pillars in between the stacking structure; and
    forming word line routings extending from steps of the staircase portions of the stacking structures that are defined by the word lines, to the word line drivers.

11. The method for manufacturing the memory device according to claim 10, wherein the word line routings extend vertically between the stacking structures.

12. The method for manufacturing the memory device according to claim 10, wherein the word line drivers are overlapped with the stacking structures.

13. The method for manufacturing the memory device according to claim 10, further comprising:
    forming bit lines and source lines running over and/or below the stacking structures, and electrically connected to the conductive pillars.

14. A method for manufacturing a memory device, comprising:
    providing a stacking structure in line shape on a substrate, wherein the stacking structure comprises alternately stacked isolation layers and sacrificial layers;
    patterning separate sections of the stacking structure, such that the sections respectively have a staircase portion and a connection portion aside the staircase portion and not being shaped into steps;
    replacing the sacrificial layers with word lines;
    forming a switching layer along a sidewall of the stacking structure;
    forming channel layers separately in lateral contact with the stacking structure through the switching layer; and
    forming pairs of conductive pillars aside the stacking structure, wherein the conductive pillars of each pair are separately in lateral contact with the stacking structure through one of the channel layers and the switching layer.

15. The method for manufacturing the memory device according to claim 14, wherein a total length of each word line is substantially equal to a total length of the stacking structure.

16. The method for manufacturing the memory device according to claim 14, wherein the word lines continuously extend through the sections of the stacking structure along the connection portions of the sections of the stacking structure.

17. The method for manufacturing the memory device according to claim 16, wherein the word lines pass through the sections of the stacking structure by narrow portions, and extend between the sections of the stacking structure by thick portions.

18. The method for manufacturing the memory device according to claim 17, wherein the narrow portions and the thick portions of each word line are alternately arranged.

19. The method for manufacturing the memory device according to claim 14, wherein the substrate is provided above word line drivers.

20. The method for manufacturing the memory device according to claim 19, further comprising:
   forming word line routings extending from steps of the staircase portions of the stacking structure that are defined by the word lines, to the word line drivers.

\* \* \* \* \*